(12) United States Patent
Bibl et al.

(10) Patent No.: US 8,809,875 B2
(45) Date of Patent: Aug. 19, 2014

(54) MICRO LIGHT EMITTING DIODE

(75) Inventors: Andreas Bibl, Los Altos, CA (US); John A. Higginson, Santa Clara, CA (US); Hung-Fai Stephen Law, Los Altos, CA (US); Hsin-Hua Hu, Los Altos, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 75 days.

(21) Appl. No.: 13/372,222

(22) Filed: Feb. 13, 2012

(65) Prior Publication Data

US 2013/0126891 A1    May 23, 2013

Related U.S. Application Data

(60) Provisional application No. 61/561,706, filed on Nov. 18, 2011, provisional application No. 61/594,919, filed on Feb. 3, 2012.

(51) Int. Cl.
*H01L 27/15*  (2006.01)
*H01L 29/18*  (2006.01)
*H01L 33/00*  (2010.01)

(52) U.S. Cl.
USPC .......... 257/79; 257/88; 257/99; 257/E33.045; 257/E33.056; 257/E33.06

(58) Field of Classification Search
None
See application file for complete search history.

(56) References Cited

U.S. PATENT DOCUMENTS

| | | |
|---|---|---|
| 3,717,743 A | 2/1973 | Costello |
| 3,935,986 A | 2/1976 | Lattari et al. |
| 5,131,582 A | 7/1992 | Kaplan et al. |
| 5,378,926 A | 1/1995 | Chi et al. |
| 5,435,857 A | 7/1995 | Han et al. |
| 5,592,358 A | 1/1997 | Shamouilian et al. |
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |

(Continued)

FOREIGN PATENT DOCUMENTS

| | | |
|---|---|---|
| JP | 07-060675 A | 3/1995 |
| JP | 3406207 | 5/1999 |

(Continued)

OTHER PUBLICATIONS

LuxVue Technology Corporation Office Action for U.S. Appl. No. 13/372,310 mailed May 1, 2012.

(Continued)

*Primary Examiner* — Julio J Maldonado
*Assistant Examiner* — Harpreet Singh
(74) *Attorney, Agent, or Firm* — Blakely Sokoloff Taylor & Zafman LLP

(57) ABSTRACT

A micro light emitting diode (LED) and a method of forming an array of micro LEDs for transfer to a receiving substrate are described. The micro LED structure may include a micro p-n diode and a metallization layer, with the metallization layer between the micro p-n diode and a bonding layer. A conformal dielectric barrier layer may span sidewalls of the micro p-n diode. The micro LED structure and micro LED array may be picked up and transferred to a receiving substrate.

33 Claims, 19 Drawing Sheets

(56) References Cited

U.S. PATENT DOCUMENTS

| | | |
|---|---|---|
| 5,996,218 A | 12/1999 | Shamouilian et al. |
| 6,071,795 A | 6/2000 | Cheung et al. |
| 6,080,650 A * | 6/2000 | Edwards ............ 438/612 |
| 6,081,414 A | 6/2000 | Flanigan et al. |
| 6,319,778 B1 | 11/2001 | Chen et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,586,875 B1 | 7/2003 | Chen et al. |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,762,069 B2 | 7/2004 | Huang et al. |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,015,513 B2 | 3/2006 | Hsieh |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,560,738 B2 | 7/2009 | Liu |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,426,227 B1 | 4/2013 | Bibl et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 * | 10/2005 | Liu ............... 257/84 |
| 2005/0232728 A1 | 10/2005 | Rice et al. |
| 2006/0038291 A1 * | 2/2006 | Chung et al. ........... 257/738 |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 * | 12/2007 | Slater et al. ............ 257/98 |
| 2008/0048206 A1 | 2/2008 | Lee et al. |
| 2008/0150134 A1 * | 6/2008 | Shinkai et al. ............ 257/737 |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2008/0315236 A1 | 12/2008 | Lu et al. |
| 2009/0068774 A1 * | 3/2009 | Slater et al. .............. 438/26 |
| 2009/0072382 A1 * | 3/2009 | Guzek .............. 257/712 |
| 2009/0146303 A1 | 6/2009 | Kwon |
| 2009/0242918 A1 * | 10/2009 | Edmond et al. ............ 257/98 |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0171094 A1 | 7/2010 | Lu et al. |
| 2010/0176415 A1 * | 7/2010 | Lee et al. ............ 257/98 |
| 2010/0188794 A1 | 7/2010 | Park et al. |
| 2010/0200884 A1 * | 8/2010 | Lee et al. ............ 257/98 |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0244077 A1 | 9/2010 | Yao |
| 2010/0248484 A1 | 9/2010 | Bower et al. |
| 2010/0276726 A1 | 11/2010 | Cho et al. |
| 2011/0001145 A1 * | 1/2011 | Park ............... 257/79 |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0244611 A1 * | 10/2011 | Kim ............... 438/29 |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(56) References Cited

OTHER PUBLICATIONS

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, SanYoul, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT International Search Report and Written Opinion for International Application No. PCT/US2012/064231, mailed Mar. 18, 2013, 9 pages.

LuxVue Technology Corporation Notice of Allowance for U.S. Appl. No. 13/372,245 mailed Mar. 11, 2013.

LuxVue Technology Corporation Office Action for U.S. Appl. No. 13/708,695 mailed Feb. 13, 2013.

LuxVue Technology Corporation Office Action for U.S. Appl. No. 13/708,704 mailed Feb. 13, 2013.

LuxVue Technology Corporation Office Action for U.S. Appl. No. 13/436,260 mailed Jan. 7, 2013.

Bower, C.A., et al., "Active-Matrix OLED Display Backplanes Using Transfer-Printed Microscale Integrated Circuits", IEEE, 2010 Electronic Components and Technology Conference, pp. 1339-1343.

Han, Min-Koo, "AM backplane for AMOLED" Proc. of ASID '06, 8-12, Oct, New Delhi, pp. 53-58.

LuxVue Technology Corporation Office Action for U.S. Appl. No. 13/372,245 mailed May 9, 2012.

LuxVue Technology Corporation Notice of Allowance for U.S. Appl. No. 13/372,310 mailed Aug. 19, 2012.

LuxVue Technology Corporation Notice of Allowance for U.S. Appl. No. 13/372,245 mailed Aug. 31, 2012.

LuxVue Technology Corporation Office Action for U.S. Appl. No. 13/372,422 mailed Jun. 5, 2012.

LuxVue Technology Corporation Office Action for U.S. Appl. No. 13/436,260 mailed Sep. 25, 2012.

LuxVue Technology Corporation Notice of Allowance for U.S. Appl. No. 13/372,422 mailed Sep. 21, 2012.

Overstolz, et al., "A Clean Wafer-Scale Chip-Release Process without Dicing Based on Vapor Phase Etching," Presented at the 17th IEEE International Conference on Micro Electro Mechanical Systems, Jan. 25-29, 2004, Maaastricht, The Netherlands. Published in the Technical Digest, ISBN 0-7803-8265-X, pp. 717-720, 4 pgs.

LuxVue Technology Corporation Notice of Allowance for U.S. Appl. No. 13/708,695 mailed Aug. 1, 2013.

LuxVue Technology Corporation Office Action for U.S. Appl. No. 13/708,695 mailed Jul. 3, 2013.

LuxVue Technology Corporation Notice of Allowance for U.S. Appl. No. 13/708,704 mailed Aug. 12, 2013.

LuxVue Technology Corporation Office Action for U.S. Appl. No. 13/708,704 mailed Jul. 17, 2013.

LuxVue Technology Corporation Notice of Allowance for U.S. Appl. No. 13/436,260 mailed Jul. 5, 2013.

LuxVue Technology Corporation Notice of Allowance for U.S. Appl. No. 13/436,314 mailed Jul. 17, 2013.

LuxVue Technology Corporation Office Action for U.S. Appl. No. 13/372,258 mailed Sep. 6, 2013.

LuxVue Technology Corporation Notice of Allowance for U.S. Appl. No. 13/372,258 mailed Jan. 30, 2014.

LuxVue Technology Corporation Office Action for U.S. Appl. No. 13/708,686 mailed Dec. 10, 2013.

\* cited by examiner

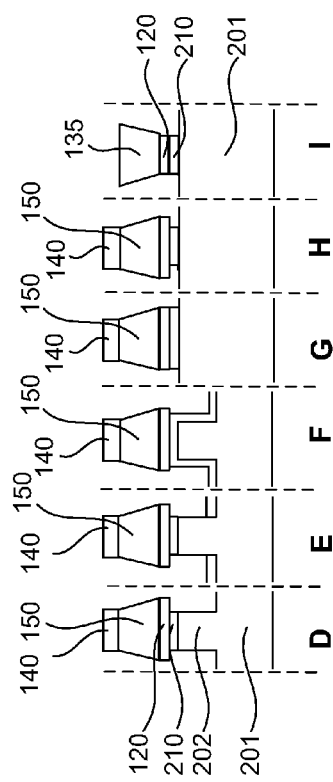
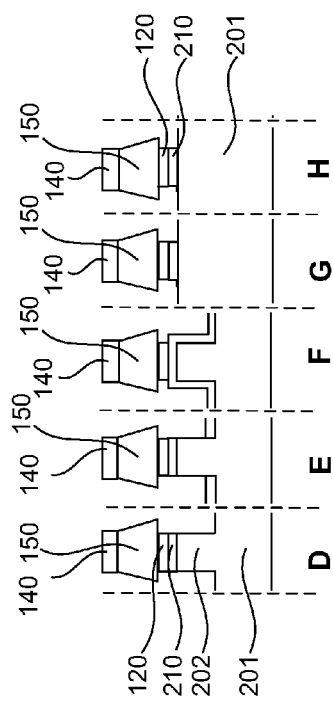

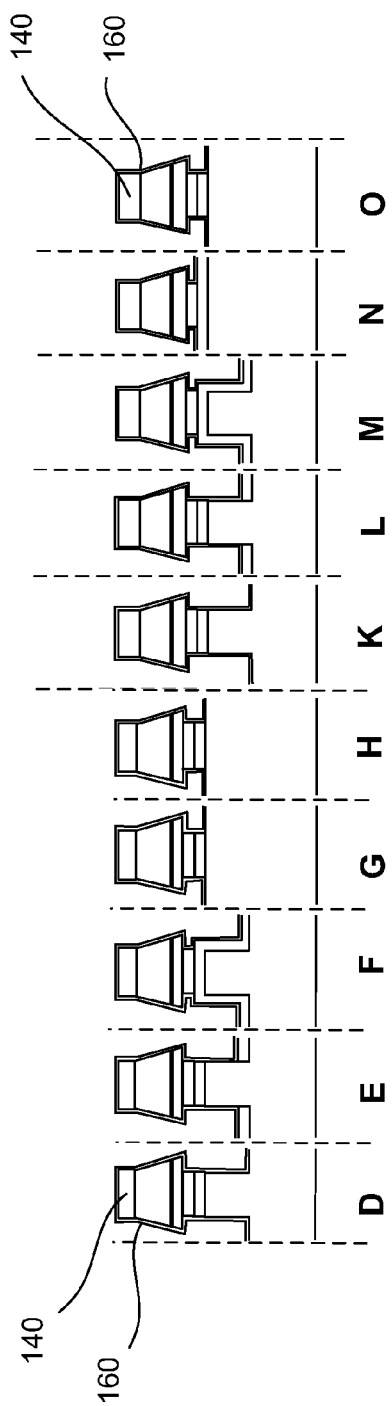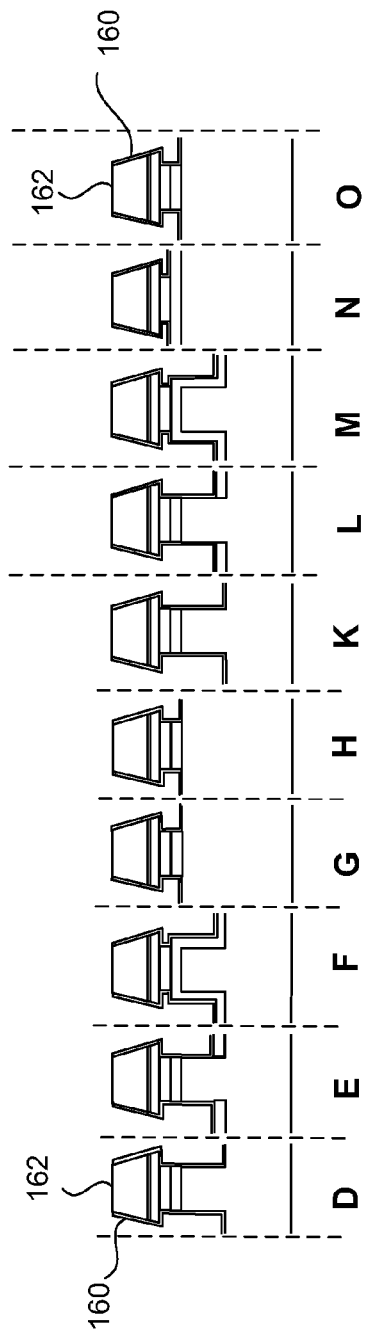

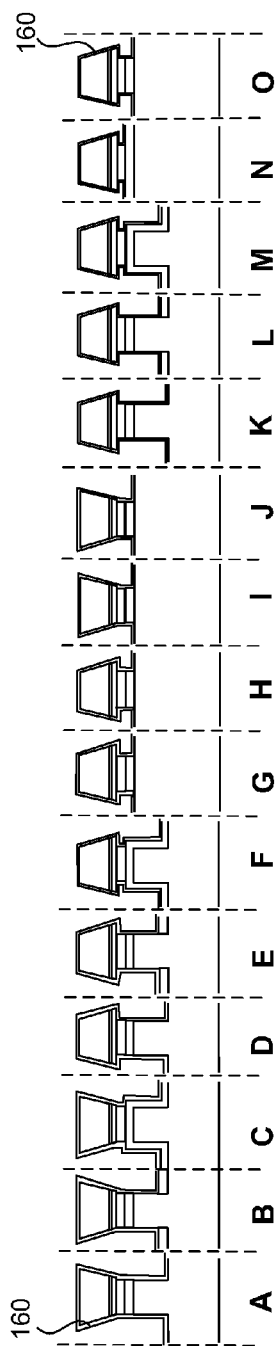
FIG. 10
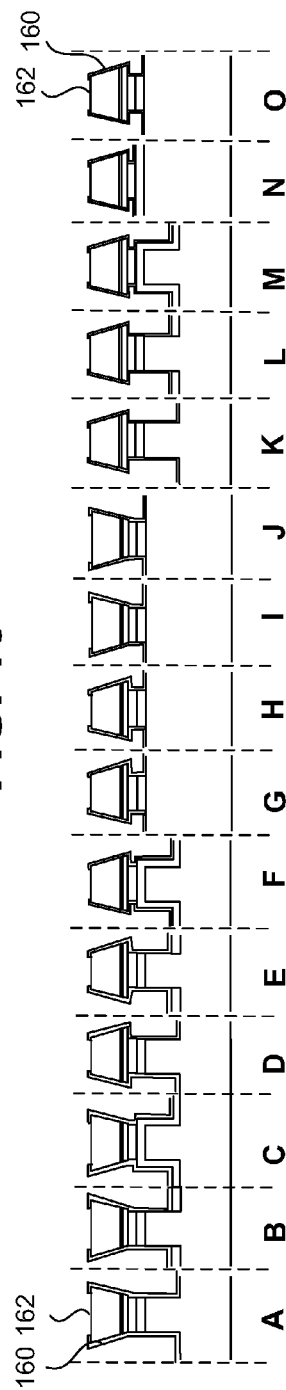
FIG. 10'
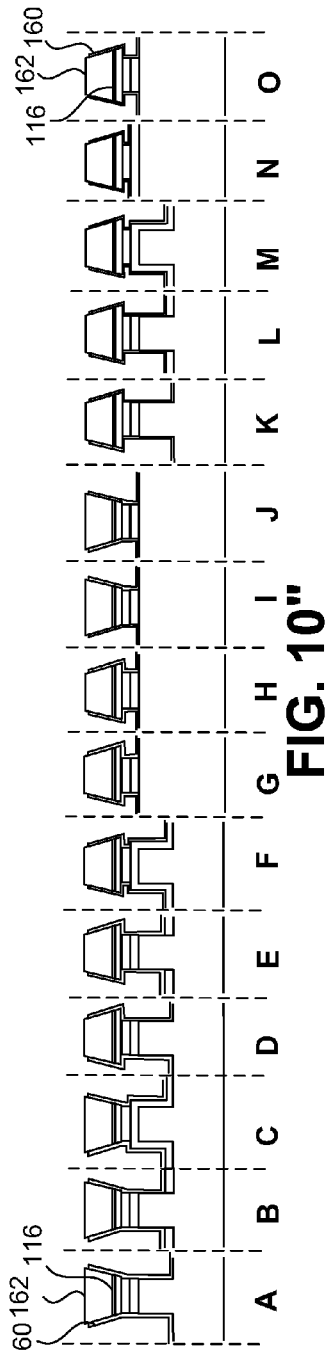
FIG. 10"

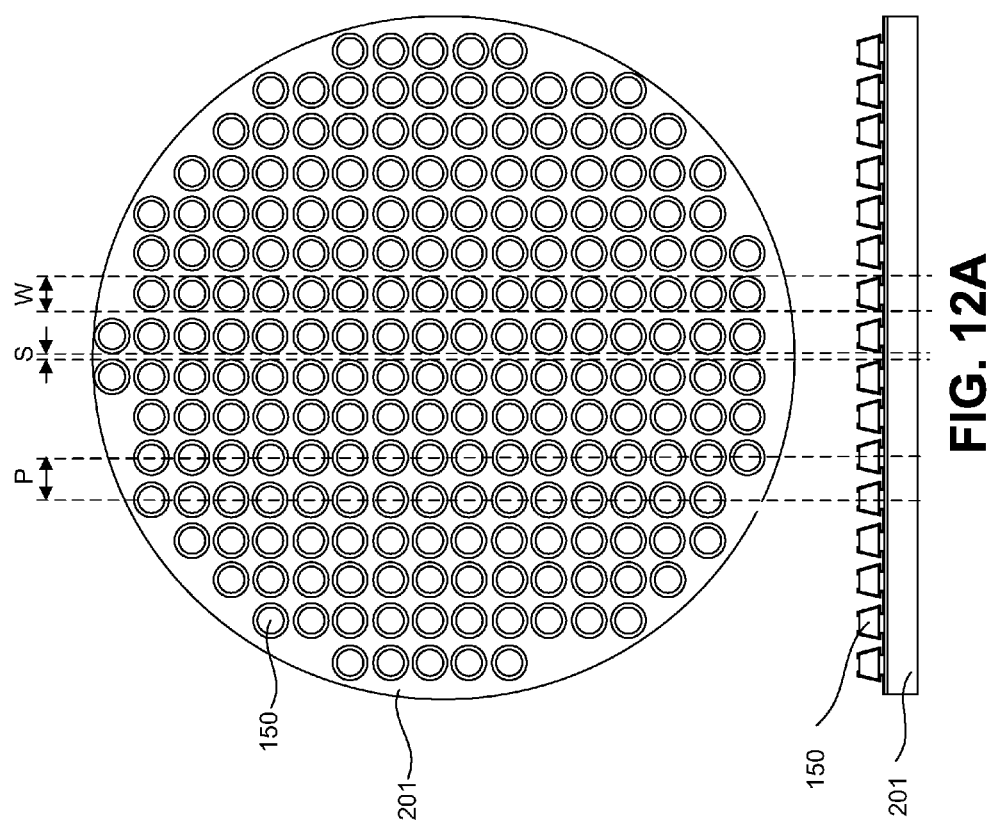

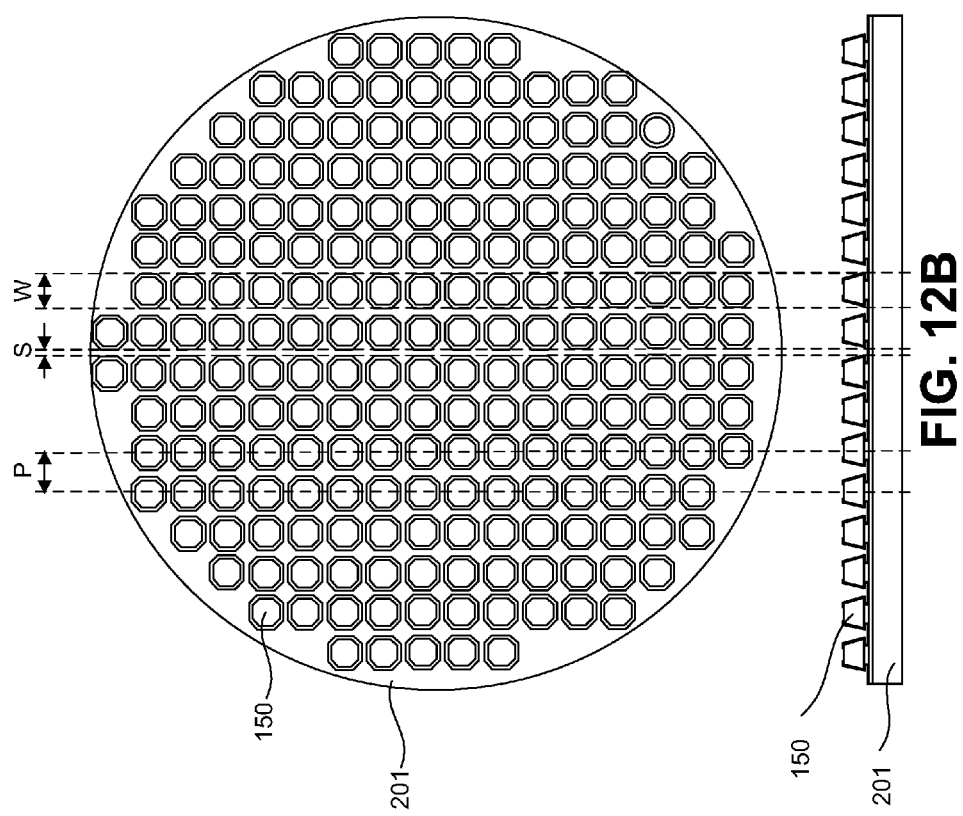

Position a transfer head over a carrier substrate having an array of micro LED structrues disposed thereon, each micro LED structure including a micro p-n diode and a metallization layer, with the metallization layer between the micro p-n diode and a bonding layer on the carrier substrate. A conformal dielectric barrier layer may optionally span sidewalls of the micro p-n diode
1300

Perform an operation to create a phase change in the bonding layer for at least one of the micro LED structures
1310

Pick up the micro p-n diode, metallization layer and optionally a portion of the conformal dielectric barrier layer for at least one of the micro LED structures with a transfer head
1320

Place the micro p-n diode, metallization layer, and optionally a portion of the conformal dielectric barrier layer for the at least one of the micro LED structures on a receiving substrate
1330

FIG. 13

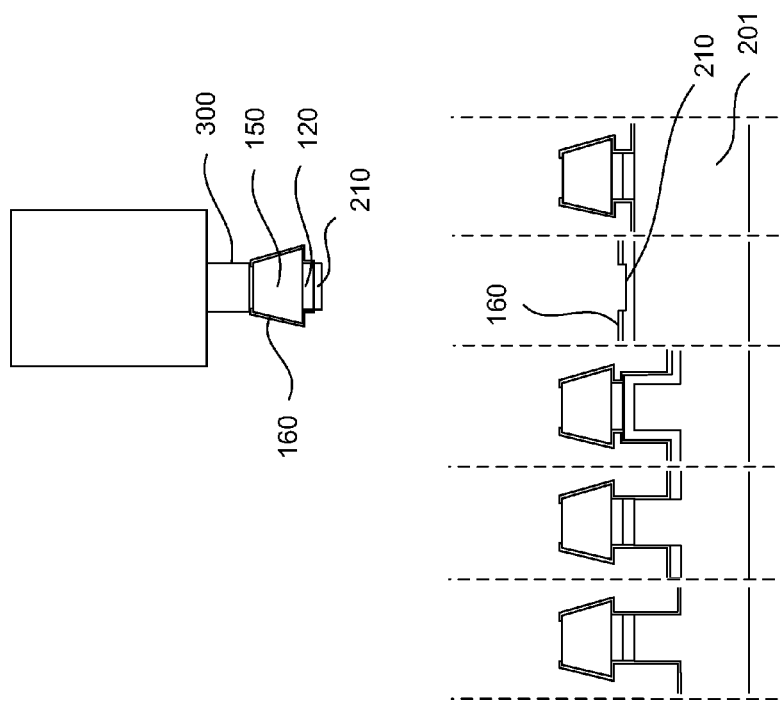

MICRO LIGHT EMITTING DIODE

RELATED APPLICATIONS

This application claims the benefit of priority from U.S. Provisional Patent Application Ser. No. 61/561,706 filed on Nov. 18, 2011 and U.S. Provisional Patent Application Ser. No. 61/594,919 filed on Feb. 3, 2012, the full disclosures of which are incorporated herein by reference.

BACKGROUND

1. Field

The present invention relates to micro semiconductor devices. More particularly embodiments of the present invention relate to a method of forming an array of micro devices such as light emitting diodes (LEDs) for transfer to a different substrate.

2. Background Information

Light emitting diodes (LEDs) based upon gallium nitride (GaN) are expected to be used in future high-efficiency lighting applications, replacing incandescent and fluorescent lighting lamps. Current GaN-based LED devices are prepared by heteroepitaxial growth techniques on foreign substrate materials. A typical wafer level LED device structure may include a lower n-doped GaN layer formed over a sapphire growth substrate, a single quantum well (SQW) or multiple quantum well (MWQ), and an upper p-doped GaN layer.

In one implementation, the wafer level LED device structure is patterned into an array of mesas on the sapphire growth substrate by etching through the upper p-doped GaN layer, quantum well layer, and into the n-doped GaN layer. An upper p-electrode is formed on the top p-doped GaN surfaces of the array of mesas, and an n-electrode is formed on a portion of the n-doped GaN layer which is in contact with the array of mesas. The mesa LED devices remain on the sapphire growth substrate in the final product.

In another implementation, the wafer level LED device structure is transferred from the growth substrate to an acceptor substrate such as silicon, which has the advantage of being more easily diced to form individual chips than a GaN/sapphire composite structure. In this implementation, the wafer level LED device structure is permanently bonded to the acceptor (silicon) substrate with a permanent bonding layer. For example, the p-electrode formed on the p-doped GaN surfaces of the array of mesas can be bonded to the acceptor (silicon) substrate with a permanent bonding layer. The sapphire growth substrate is then removed to expose the inverted wafer level LED device structure, which is then thinned to expose the array of mesas. N-contacts are then made with the exposed n-doped GaN, and p-contacts are made on the silicon surface which is in electrical contact with the p-electrode. The mesa LED devices remain on the acceptor substrate in the final product. The GaN/silicon composite can also be diced to form individual chips.

SUMMARY OF THE INVENTION

A micro light emitting diode (LED) and a method of forming an array of micro LEDs for transfer to a receiving substrate are described. For example, the receiving substrate may be, but is not limited to, a display substrate, a lighting substrate, a substrate with functional devices such as transistors or integrated circuits (ICs), or a substrate with metal redistribution lines. In an embodiment, a micro LED structure includes a micro p-n diode and a metallization layer, with the metallization layer between the micro p-n diode and a bonding layer formed on a substrate. The metallization layer may include one or more layers. For example, the metallization layer may include an electrode layer and a barrier layer between the electrode layer and the bonding layer. The micro p-n diode and metallization layer may each have a top surface, a bottom surface and sidewalls. In an embodiment, the bottom surface of the micro p-n diode is wider than the top surface of the micro p-n diode, and the sidewalls are tapered outwardly from top to bottom. The top surface of the micro p-n diode may also be wider than the bottom surface of the p-n diode, or approximately the same width. In an embodiment, the bottom surface of the micro p-n diode is wider than the top surface of the metallization layer. The bottom surface of the micro p-n diode may also be wider than the top surface of the metallization layer, or approximately the same width as the top surface of the metallization layer.

A conformal dielectric barrier layer may optionally be formed over the micro p-n diode and other exposed surfaces. The conformal dielectric barrier layer may be thinner than the micro p-n diode, metallization layer and optionally the bonding layer so that the conformal dielectric barrier layer forms an outline of the topography it is formed on. In an embodiment, the conformal dielectric barrier layer spans sidewalls of the micro p-n diode, and may cover a quantum well layer in the micro p-n diode. The conformal dielectric barrier layer may also partially span the bottom surface of the micro p-n diode, as well as span sidewalls of the metallization layer. In some embodiments, the conformal dielectric barrier layer also spans sidewalls of a patterned bonding layer. A contact opening may be formed in the conformal dielectric barrier layer exposing the top surface of the micro p-n diode. The contact opening can have a width which is greater than, less than, or approximately the same width as the top surface of the micro p-n diode. In one embodiment, the contact opening has a width which is less than the width of the top surface of the micro p-n diode, and the conformal dielectric barrier layer forms a lip around the edges of the top surface of the micro p-n diode.

In some embodiments the bonding layer may be formed of a material which has a liquidus temperature or melting temperature below approximately 350° C., or more specifically below approximately 200° C. For example, the bonding layer may include indium, tin or a thermoplastic polymer such as polyethylene or polypropylene. The bonding layer may be laterally continuous across the substrate, or may also be formed in laterally separate locations. For example, a laterally separate location of the bonding layer may have a width which is less than or approximately the same width as the bottom surface of the micro p-n diode or metallization layer.

In an embodiment, a micro LED array includes a plurality of locations of a bonding layer on a carrier substrate, and a corresponding plurality of micro LED structures on the plurality of locations of the bonding layer. Each micro LED structure includes a micro p-n diode and a metallization layer with the metallization layer between the micro p-n diode and a respective location of the bonding layer. A conformal dielectric barrier layer can be deposited on the micro LED array on the substrate, with the conformal dielectric barrier layer spanning sidewalls of each micro p-n diode. The conformal dielectric barrier layer may also partially span the bottom surface of each micro p-n diode, and sidewalls of each metallization layer. A plurality of contact openings may be formed in the conformal dielectric barrier layer exposing a top surface of each micro p-n diode in which each contact opening has a width which may be greater than, less than, or approximately the same width as the top surface of each corresponding micro p-n diode.

The plurality of locations of the bonding layer may or may not be laterally separate from one another. In some embodiments, the plurality of locations of the bonding layer are laterally separate and the conformal dielectric barrier layer spans sidewalls of each of the plurality of laterally separate locations of the bonding layer. In some embodiments, the substrate includes a respective plurality of pillars on which the plurality of locations of the bonding layer are formed. For example, each micro p-n diode may include a bottom surface which is either approximately the same width as a top surface of a respective pillar or wider than the top surface of f the respective pillar. The pillars may also have a height which is greater than a respective thickness of the locations of the bonding layer. In an embodiment, the respective height is at least twice the respective thickness.

A micro LED structure and micro LED array may be formed utilizing existing heterogeneous growth technologies. In an embodiment a p-n diode layer and metallization layer are transferred from a growth substrate to a carrier substrate. In accordance with embodiments of the invention, the p-n diode layer and the metallization layer may be patterned prior to or after transfer to the carrier substrate. Transferring the p-n diode layer and the metallization layer to the carrier substrate may include bonding the metallization layer to a bonding layer on the carrier substrate. For example, the bonding layer may have a liquidus temperature or melting temperature below approximately 350° C., or more specifically below 200° C. For example, the bonding layer may be formed of indium or an indium alloy. After patterning the p-n diode layer and the metallization layer to form a plurality of separate micro p-n diodes and a plurality of separate locations of the metallization layer a conformal dielectric barrier layer is formed spanning the sidewalls of the plurality of separate micro p-n diodes. The conformal dielectric barrier layer may form an outline of the topography onto which it is formed, and may be thinner than the micro p-n diodes and the metallization layer. For example, the conformal dielectric barrier layer may be formed by atomic layer deposition (ALD). The conformal dielectric barrier layer may also be formed on a portion of the bottom surface of each separate micro p-n diode.

In an embodiment, the p-n diode layer and a patterned metallization layer including a plurality of separate locations of the metallization layer on the p-n diode layer are transferred from the growth substrate to the carrier substrate. The p-n diode layer may be partially patterned prior to transferring from the growth substrate to the carrier substrate, to form micro mesas separated by trenches in the p-n diode layer. In an embodiment, a plurality of pillars are formed on the carrier substrate prior to transferring the p-n diode layer and patterned metallization layer to the carrier substrate. The bonding layer may be formed over the plurality of pillars on the carrier substrate prior to transferring the p-n diode layer and the patterned metallization layer to the carrier substrate.

In an embodiment, the metallization layer is patterned to form a plurality of separate locations of the metallization layer after transferring the metallization layer and the p-n diode layer from the growth substrate to the carrier substrate. In such an embodiment, the p-n diode layer is patterned to form a plurality of separate micro p-n diodes, followed by patterning the metallization layer. Patterning of the metallization layer may include etching the metallization layer until a maximum width of the plurality of separate locations of the metallization layer are less than a width of the bottom surface of each of the plurality of separate micro p-n diodes. In an embodiment, the bonding layer is patterned after transferring the p-n diode layer and the metallization layer form the growth substrate to the carrier substrate. For example, the bonding layer can be etched until a maximum width of the plurality of separate locations of the bonding layer are less than a width of a bottom surface of each of the plurality of separate micro p-n diodes. A plurality of pillars can also be formed on the carrier substrate prior to transferring the p-n diode layer and the metallization layer from the growth substrate to the carrier substrate. The bonding layer may be formed over the plurality of pillars on the carrier substrate prior to transferring the p-n diode layer and the patterned metallization layer to the carrier substrate.

Once formed, the micro LED structure and micro LED array can be picked up and transferred to a receiving substrate. A transfer head can be positioned over the carrier substrate having an array of micro LED structures disposed thereon, and an operation is performed to create a phase change in the bonding layer for at least one of the micro LED structures. For example, the operation may be heating the bonding layer above a liquidus temperature or melting temperature of the bonding layer, or altering a crystal phase of the bonding layer. The at least one micro LED structure including the micro p-n diode and the metallization layer, and optionally a portion of the bonding layer for the at least one of the micro LED structures may be picked up with a transfer head and placed on a receiving substrate. If a conformal dielectric barrier layer has already been formed, a portion of the conformal dielectric barrier layer may also be picked up with the micro p-n diode and the metallization layer. Alternatively, a conformal dielectric barrier layer can be formed over the micro LED structure, or plurality of micro LED structures, after being placed on the receiving substrate.

In an embodiment, the conformal dielectric barrier layer spans a portion of the bottom surface of the micro p-n diode, spans sidewalls of the metallization layer, and spans across a portion of the bonding layer adjacent the metallization layer. The conformal dielectric barrier layer may be cleaved after contacting the micro LED structure with the transfer head and/or creating the phase change in the bonding layer, which may be prior to picking up the micro p-n diode and the metallization layer with the transfer head. For example, cleaving the conformal dielectric barrier layer may include transferring a pressure from the transfer head to the conformal dielectric barrier layer and/or heating the bonding layer above a liquidus temperature of the bonding layer.

BRIEF DESCRIPTION OF THE DRAWINGS

FIG. 7'-7" are a cross-sectional side view illustrations etching layers in accordance with an embodiment of the invention.

FIGS. 9-9' are cross-sectional side view illustrations of the formation of contact openings in a micro LED array in accordance with an embodiment of the invention.

FIGS. 10-10" are cross-sectional side view illustrations of the formation of contact openings in a micro LED array in accordance with an embodiment of the invention.

FIGS. 12A-12B include top and cross-sectional side view illustrations of a carrier wafer and array of micro LED structures including micro p-n diodes in accordance with an embodiment of the invention.

FIG. 13 is an illustration of a method of picking up and transferring a micro LED structure from a carrier substrate to a receiving substrate in accordance with an embodiment of the invention.

FIG. 14 is a cross-sectional side view illustration of a transfer head picking up a micro LED structure from a carrier substrate in accordance with an embodiment of the invention.

DETAILED DESCRIPTION OF THE INVENTION

Figure 1A:
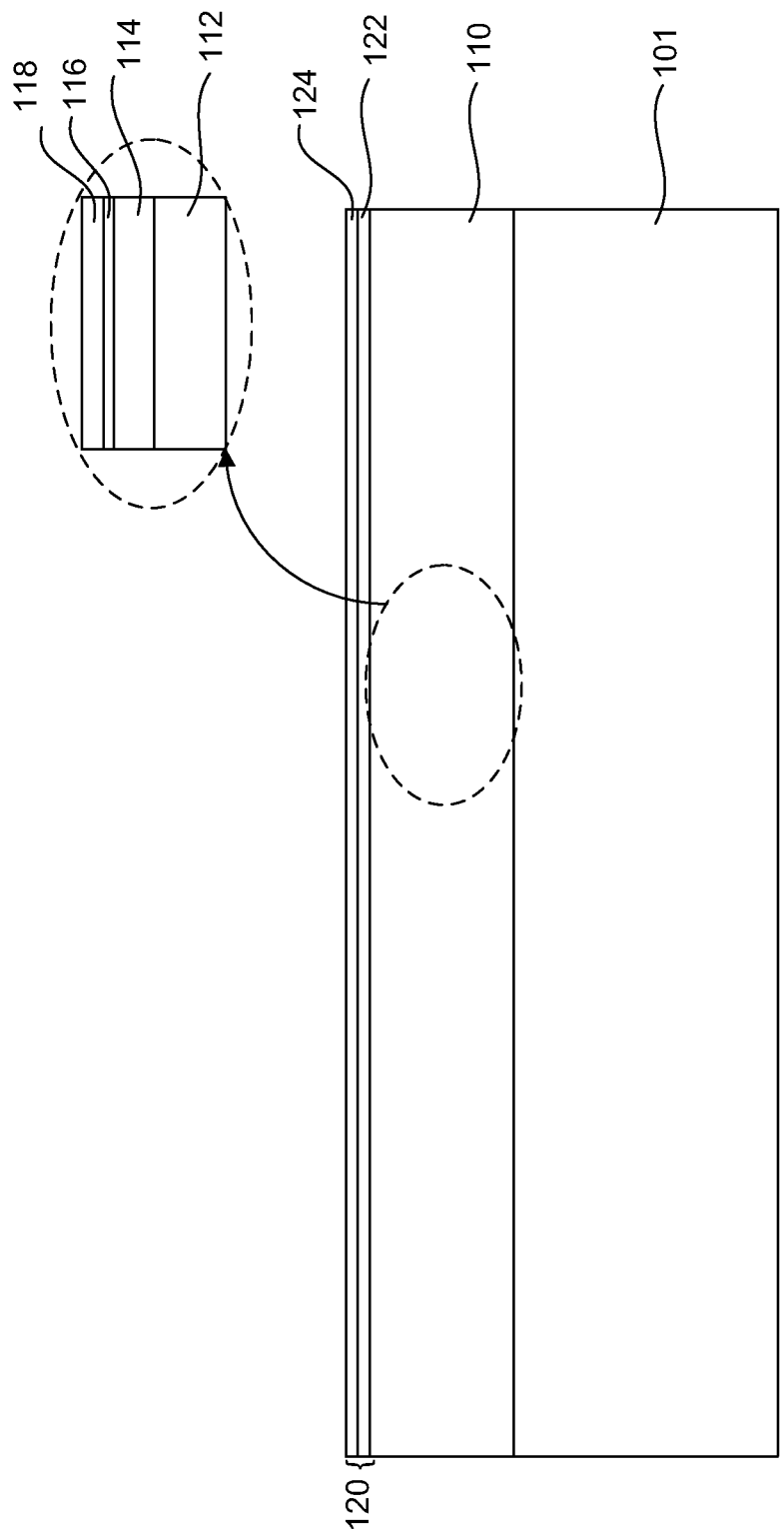
FIG. 1A is a cross-sectional side view illustration of a bulk LED substrate in accordance with an embodiment of the invention.

Embodiments of the present invention describe micro semiconductor devices and a method of forming an array of micro semiconductor devices such as micro light emitting diodes (LEDs) for transfer to a receiving substrate. For example, the receiving substrate may be, but is not limited to, a display substrate, a lighting substrate, a substrate with functional devices such as transistors or integrated circuits (ICs), or a substrate with metal redistribution lines. While embodiments of the present invention are described with specific regard to micro LEDs comprising p-n diodes, it is to be appreciated that embodiments of the invention are not so limited and that certain embodiments may also be applicable to other micro semiconductor devices which are designed in such a way so as to perform in a controlled fashion a predetermined electronic function (e.g. diode, transistor, integrated circuit) or photonic function (LED, laser).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "spanning," "over," "to," "between" and "on" as used herein may refer to a relative position of one layer with respect to other layers. One layer "spanning," "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures in accordance with embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

In one aspect, embodiments of the invention describe a method of processing a bulk LED substrate into an array of micro LED structures which are poised for pick up and transfer to a receiving substrate. In this manner, it is possible to integrate and assemble micro LED structures into heterogeneously integrated systems. The micro LED structures can be picked up and transferred individually, in groups, or as the entire array. Thus, the micro LED structures in the array of micro LED structures are poised for pick up and transfer to a receiving substrate such as display substrate of any size ranging from micro displays to large area displays, and at high transfer rates. In some embodiments, arrays of micro LED structures which are poised for pick up are described as having a 10 μm by 10 μm pitch, or 5 μm by 5 μm pitch. At these densities a 6 inch substrate, for example, can accommodate approximately 165 million micro LED structures with a 10 μm by 10 μm pitch, or approximately 660 million micro LED structures with a 5 μm by 5 μm pitch. Thus, a high density of pre-fabricated micro devices with a specific functionality may be produced in a manner in which they are poised for pick up and transfer to a receiving substrate. The techniques described herein are not limited to micro LED structures, and may also be used in the manufacture of other micro devices.

In another aspect, embodiments of the invention describe a micro LED structure and micro LED array in which each micro p-n diode is formed over a respective location of a bonding layer. The respective locations of the bonding layer may or may not be laterally separate locations. An operation may be performed on a respective location of the bonding layer corresponding to a micro LED during the micro LED pick up process in which the respective location of the bonding layer undergoes a phase change which assists in the pick up process. For example, the respective location of the bonding layer may change from solid to liquid in response to a temperature cycle. In the liquid state the respective location of the bonding layer may retain the micro p-n diode in place on a carrier substrate through surface tension forces, while also providing a medium from which the micro p-n diode is readily releasable. In addition, the liquid state may act as a cushion or shock absorber to absorb forces exerted by a transfer head if a transfer head makes contact with the micro LED structure during the pick up process. In this manner, the liquid state may compensate for non-uniformities in the topography in the micro LED array or transfer head array by smoothing out over the underlying surface in response to compressive forces exerted by a transfer head. In other embodiments, the respective location of the bonding layer may not undergo a complete phase transformation. For example, the respective location of the bonding layer may become substantially more malleable in response to a temperature cycle while partially remaining in the solid state. In another embodiment, the respective location of the bonding layer may undergo a crystal phase transformation in response to an operation, such as a temperature cycle.

Referring now to FIG. 1, a semiconductor device layer 110 may be formed on a substrate 101. In an embodiment, semiconductor device layer 110 may include one or more layers and is designed in such a way so as to perform in a controlled fashion a predetermined electronic function (e.g. diode, transistor, integrated circuit) or photonic function (LED, laser). It is to be appreciated that while semiconductor device layer 110 may be designed in such a way so as to perform in a controlled fashion in a predetermined function, that the semiconductor device layer 110 may not be fully functionalized. For example, contacts such as an anode or cathode may not yet be formed. In the interest of conciseness and to not obscure embodiments of the invention, the following description is made with regard to semiconductor device layer 110 as a p-n diode layer 110 grown on a growth substrate 101 in accordance with conventional heterogeneous growth conditions.

The p-n diode layer 110 may include a compound semiconductor having a bandgap corresponding to a specific region in the spectrum. For example, the p-n diode layer 110 may include one or more layers based on II-VI materials (e.g. ZnSe) or III-V nitride materials (e.g. GaN, AlN, InN, and their alloys). Growth substrate 101 may include any suitable substrate such as, but not limited to, silicon, SiC, GaAs, GaN and sapphire ($Al_2O_3$).

In a particular embodiment, growth substrate 101 is sapphire, and the p-n diode layer 110 is formed of GaN. Despite the fact that sapphire has a larger lattice constant and thermal expansion coefficient mismatch with respect to GaN, sapphire is reasonably low cost, widely available and its transparency is compatible with excimer laser-based lift-off (LLO) techniques. In another embodiment, another material such as SiC may be used as the growth substrate 101 for a GaN p-n diode layer 110. Like sapphire, SiC substrates may be transparent. Several growth techniques may be used for growth of p-n diode layer 110 such as metalorganic chemical vapor deposition (MOCVD). GaN, for example, can be grown by simultaneously introducing trimethylgallium (TMGa) and ammonia ($NH_3$) precursors into a reaction chamber with the sapphire growth substrate 101 being heated to an elevated temperature such as 800° C. to 1,000° C. In the particular embodiment illustrated in FIG. 1A, p-n diode layer 110 may include a bulk GaN layer 112, an n-doped layer 114, a quantum well 116 and p-doped layer 118. The bulk GaN layer 112 may be n-doped due to silicon or oxygen contamination, or intentionally doped with a donor such as silicon. N-doped GaN layer 114 may likewise be doped with a donor such as silicon, while p-doped layer 118 may be doped with an acceptor such as magnesium. A variety of alternative p-n diode configurations may be utilized to form p-n diode layer 110. Likewise, a variety of single quantum well (SQW) or multiple quantum well (MQW) configurations may be utilized to form quantum well 116. In addition, various buffer layers may be included as appropriate. In one embodiment, the sapphire growth substrate 101 has a thickness of approximately 200 μm, bulk GaN layer 112 has a thickness of approximately 5 μm, n-doped layer 114 has a thickness of approximately 0.1 μm-3 μm, quantum well layer 116 has a thickness less than approximately 0.3 μm and p-doped layer 118 has a thickness of approximately 0.1 μm-1 μm.

A metallization layer 120 may then be formed over the p-n diode layer 110. As illustrated in FIG. 1A, metallization layer 120 may include an electrode layer 122 and optionally a barrier layer 124, though other layers may be included. In an embodiment, metallization layer has a thickness of approximately 0.1 μm-2 μm. Electrode layer 122 may make ohmic contact to the p-doped GaN layer 118, and may be formed of a high work-function metal such as Ni, Au, Ag, Pd and Pt. In an embodiment, electrode layer 122 may be reflective to light emission. In another embodiment, electrode layer 122 may also be transparent to light emission. Transparency may be accomplished by making the electrode layer very thin to minimize light absorption. Barrier layer 124 may optionally be included in the metallization layer 120 to prevent diffusion of impurities into the p-n diode 110. For example, barrier layer 124 may include, but is not limited to, Pd, Pt, Ni, Ta, Ti and TiW. In certain embodiments, barrier layer 124 may prevent the diffusion of components from the bonding layer into the p-n diode layer 110.

In accordance with certain embodiments of the invention, p-n diode layer 110 and metallization layer 120 are grown on a growth substrate 101 and subsequently transferred to a carrier substrate 201, such as one illustrated in FIGS. 2A-2E and described in more detail in the following description. As described in more detail in the following figures and description, the metallization layer 120 and p-n diode layer 110 can be patterned prior to transfer to a carrier substrate 201. The carrier substrate 201 and bonding layer 210 may also be patterned prior to transfer of the p-n diode layer 110 and metallization layer 120 to the carrier substrate 201. Accordingly, embodiments of the invention may be implemented in a multitude of variations during formation of an array of micro LEDs for subsequent transfer to a receiving substrate.

Figure 1B:
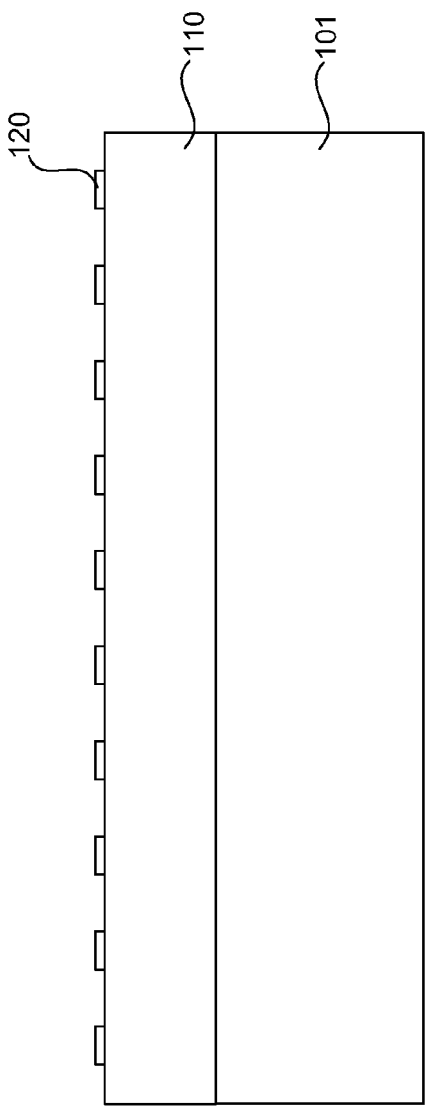
FIG. 1B is a cross-sectional side view illustration of a patterned metallization layer in accordance with an embodiment of the invention.

Referring now to FIG. 1B metallization layer 120 may be patterned prior to transfer to a carrier substrate 201. In an embodiment, the structure of FIG. 1B may be achieved by forming a patterned photoresist layer over the p-n diode layer 110 followed by deposition of the metallization layer 120. The photoresist layer is then lifted off (along with the portion of the metallization layer on the photoresist layer) leaving behind the laterally separate locations of metallization layer 120 illustrated in FIG. 1B. In certain embodiments, the pitch of the laterally separate locations of metallization layer 120 may be 5 μm, 10 μm, or larger corresponding to the pitch of the array of micro LEDs. For example, a 5 μm pitch may be formed of 3 μm wide laterally separate locations of metallization layer 120 separated by a 2 μm spacing. A 10 μm pitch may be formed of 8 μm wide separate locations of metallization layer 120 separated by a 2 μm spacing. Though, these dimensions are meant to be exemplary and embodiments of the invention are not so limited. In some embodiments, the width of the laterally separate locations of metallization layer 120 is less than or equal to the width of the bottom surface of the array of micro p-n diodes 150 as discussed in further detail in the following description and figures.

Figure 1C:
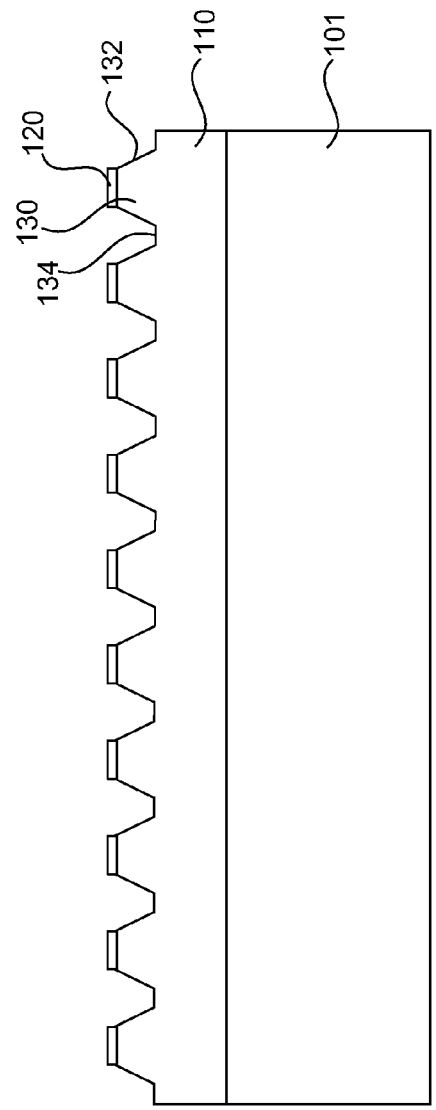
FIG. 1C is a cross-sectional side view illustration of a patterned p-n diode layer in accordance with an embodiment of the invention.

Referring now to FIG. 1C patterning of the metallization layer 120 may be followed by patterning of p-n diode layer 110. In an embodiment, the structure of FIG. 1C may be achieved by forming a second patterned photoresist layer over the laterally separate locations of metallization layer 120 and an etchant is applied to etch the p-n diode layer 110 to etch trenches 134 and form a plurality of micro mesas 130. Referring again to the enlarged section of p-n diode layer 110 in FIG. 1A, in an embodiment, etching is performed to etch trenches through the p-doped layer 118, quantum well 116, and into the n-doped layer 114 or bulk layer 112. Etching of the GaN p-n diode layer 110 can be performed utilizing dry plasma etching techniques such as reactive ion etching (RIE), electro-cyclotron resonance (ECR), inductively coupled plasma reactive ion etching ICP-RIE, and chemically assisted ion-beam etching (CAIBE). The etch chemistries may be halogen-based, containing species such as $Cl_2$, $BCl_3$ or $SiCl_4$. In the particular embodiment illustrated in FIG. 1C, micro mesas 130 may have tapered sidewalls 132 up to 15 degrees. For example, RIE with a chlorine-based etch chemistry may be utilized. Alternatively, the sidewalls may be vertical. For example, ICP-RIE which a chlorine-based etch chemistry may be utilized to obtain vertical sidewalls.

In certain embodiments, the pitch of the micro mesas 130 may be 5 µm, 10 µm, or larger. For example, a micro mesa 130 array with a 5 µm pitch may be formed of 3 µm wide micro mesas separated by a 2 µm spacing. A micro mesa 130 array with a 10 µm pitch may be formed of 8 µm wide micro mesas separated by a 2 µm spacing. Though, these dimensions are meant to be exemplary and embodiments of the invention are not so limited.

Figure 2A:
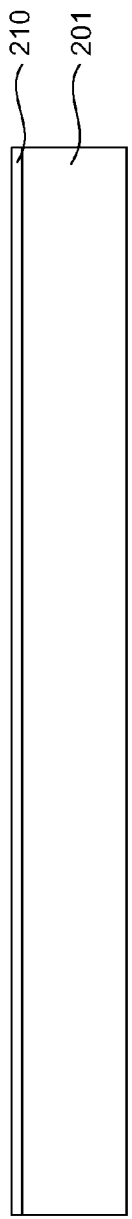
FIGS. 2A-2E are cross-sectional side view illustrations of a carrier substrate with bonding layer in accordance with an embodiment of the invention.
Figure 2B:
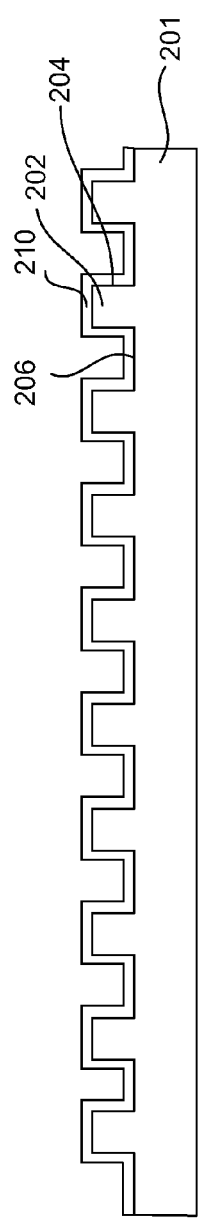
Figure 2C:
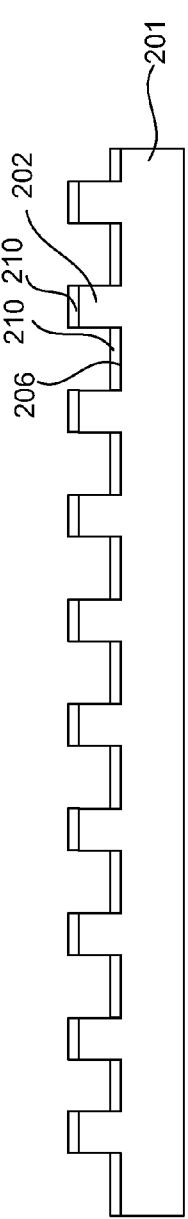
Figure 2D:
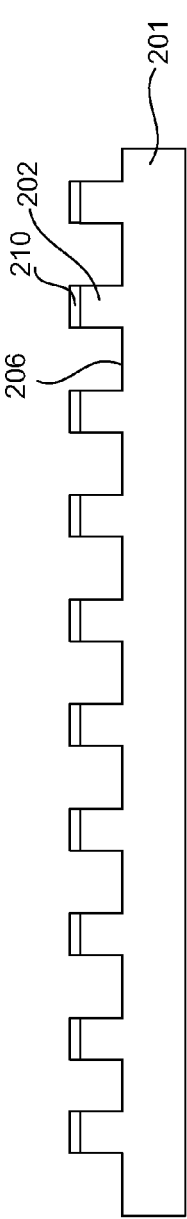

FIGS. 2A-2E are cross-sectional side view illustrations of various embodiments of a carrier substrate 201 with bonding layer 210 for bonding to the metallization layer 120 on growth substrate 101. FIG. 2A illustrates a carrier substrate 201 and bonding layer 210 which are not patterned prior to bonding. FIGS. 2B-2D illustrate a carrier substrate 201 which has been patterned to form a plurality of posts 202 having sidewalls 204 and separated by trenches 206. Posts 202 may have a maximum width which is equal to or less than a width of the micro p-n diodes 135, 150, as will become more apparent in the following description and figures. In an embodiment, the trench posts 202 are at least twice as tall as a thickness of the bonding layer 210. In an embodiment, bonding layer 210 may have a thickness of approximately 0.1 µm-2 µm, and trench posts have a height of at least 0.2 µm-4 µm. In the particular embodiment illustrated in FIG. 2B, a conformal bonding layer 210 is formed over the posts 202, and on the sidewalls 204 and within trenches 206. In the particular embodiment illustrated in FIG. 2C, bonding layer 210 is anisotropically deposited so that it is formed only on the top surface of posts 202 and within the trenches 206, without a significant amount being deposited on the sidewalls 204. In the particular embodiment illustrated in FIG. 2D, bonding layer 210 is formed only on the top surface of posts 202. Such a configuration may be formed by patterning the posts 202 and bonding layer 210 with the same patterned photoresist. In the particular embodiment illustrated in FIG. 2E, the laterally separate locations of the bonding layer 210 may be formed with a photoresist lift off technique in which a blanket layer of the bonding layer is deposited over a patterned photoresist layer, which is then lifted off (along with the portion of the bonding layer on the photoresist layer) leaving behind the laterally separate locations of the bonding layer 210 illustrated in FIG. 2E, though other processing techniques may be used.

Figure 2E:
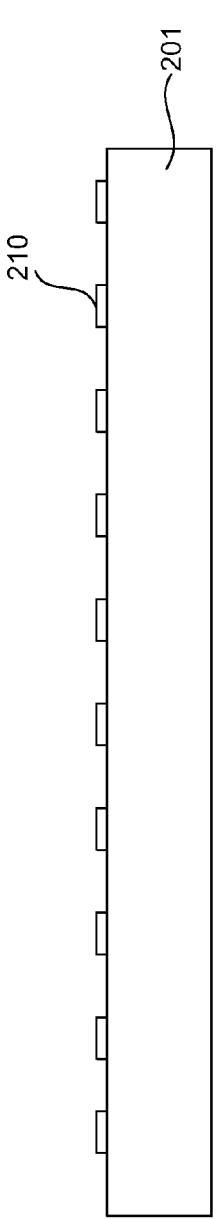

As described above with regard to FIGS. 2B-2E and FIGS. 1B-1C, certain embodiments of the invention include laterally separate locations of the metallization layer 120 and/or laterally separate locations of the bonding layer 210. With regard to FIG. 2B, in which a conformal bonding layer 210 is formed over the posts 202, and on the sidewalls 204 and within trenches 206, the particular locations of the bonding layer on top of the posts 202 are laterally separated by the trenches 206. Thus, even though the conformal bonding layer 210 is continuous, the locations of the bonding layer 210 on top of the posts 202 are laterally separate locations Likewise, the individual discrete locations of the bonding layer 210 in FIG. 2E are laterally separated by the space between them. Where posts 202 exist, the relationship of the bonding layer 210 thickness to post 202 height may factor into the lateral separation of the locations of the bonding layer 210.

Bonding layer 210 may be formed from a variety of suitable materials. Bonding layer may be formed from a material which is capable of adhering a micro LED structure to a carrier substrate. In an embodiment, bonding layer 210 may undergo a phase change in response to an operation such as change in temperature. In an embodiment, bonding layer may be removable as a result of the phase change. In an embodiment, bonding layer may be remeltable or reflowable. In an embodiment, the bonding layer may have a liquidus temperature or melting temperature below approximately 350° C., or more specifically below approximately 200° C. At such temperatures the bonding layer may undergo a phase change without substantially affecting the other components of the micro LED structure. For example, the bonding layer may be formed of a metal or metal alloy, or of a thermoplastic polymer which is removable. In an embodiment, the bonding layer may be conductive. For example, where the bonding layer undergoes a phase change from solid to liquid in response to a change in temperature a portion of the bonding layer may remain on the micro LED structure during the pick up operation as described in more detail the following description. In such an embodiment, it may be beneficial that the bonding layer is formed of a conductive material so that it does not adversely affect the micro LED structure when it is subsequently transferred to a receiving substrate. In this case, the portion of conductive bonding layer remaining on the micro LED structure during the transfer operation may aid in bonding the micro LED structure to a conductive pad on the receiving substrate.

Solders may be suitable materials for bonding layer 210 since many are generally ductile materials in their solid state and exhibit favorable wetting with semiconductor and metal surfaces. A typical alloy melts not a single temperature, but over a temperature range. Thus, solder alloys are often characterized by a liquidus temperature corresponding to the lowest temperature at which the alloy remains liquid, and a solidus temperature corresponding to the highest temperature at which the alloy remains solid. An exemplary list of low melting solder materials which may be utilized with embodiments of the invention are provided in Table 1.

TABLE 1

| Chemical composition | Liquidus Temperature (° C.) | Solidus Temperature (° C.) |
| --- | --- | --- |
| 100 In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 50In50Sn | 125 | 118 |
| 52Sn48In | 131 | 118 |

TABLE 1-continued

| Chemical composition | Liquidus Temperature (° C.) | Solidus Temperature (° C.) |
|---|---|---|
| 58Bi42Sn | 138 | 138 |
| 97In3Ag | 143 | 143 |
| 58Sn42In | 145 | 118 |
| 99.3In0.7Ga | 150 | 150 |
| 95In5Bi | 150 | 125 |
| 99.4In0.6Ga | 152 | 152 |
| 99.6In0.4Ga | 153 | 153 |
| 99.5In0.5Ga | 154 | 154 |
| 60Sn40Bi | 170 | 138 |
| 100Sn | 232 | 232 |
| 95Sn5Sb | 240 | 235 |

An exemplary list thermoplastic polymers which may be utilized with embodiments of the invention are provided in Table 2.

TABLE 2

| Polymer | Melting Temperature (° C.) |
|---|---|
| Acrylic (PMMA) | 130-140 |
| Polyoxymethylene (POM or Acetal) | 166 |
| Polybutylene terephthalate (PBT) | 160 |
| Polycaprolactone (PCL) | 62 |
| Polyethylene terephthalate (PET) | 260 |
| Polycarbonate (PC) | 267 |
| Polyester | 260 |
| Polyethylene (PE) | 105-130 |
| Polyetheretherketone (PEEK) | 343 |
| Polylactic acid (PLA) | 50-80 |
| Polypropylene (PP) | 160 |
| Polystyrene (PS) | 240 |
| Polyvinylidene chloride (PVDC) | 185 |

In accordance with embodiments of the invention, bonding layer 210 is formed with a uniform thickness and may be deposited by a variety of suitable methods depending upon the particular composition. For example, solder compositions may be sputtered, deposited by electron beam (E-beam) evaporation, or plated with a seed layer to obtain a uniform thickness.

Posts 202 may be formed from a variety of materials and techniques. In an embodiment, posts 202 may be formed integrally with carrier substrate 201 by patterning the carrier substrate 201 by an etching or embossing process. For example, carrier substrate 201 may be a silicon substrate with integrally formed posts 202. In another embodiment, posts can be formed on top of carrier substrate 201. For example, posts 202 may be formed by a plate up and photoresist lift off technique. Posts can be formed from any suitable material including semiconductors, metals, polymers, dielectrics, etc.

Figure 3:
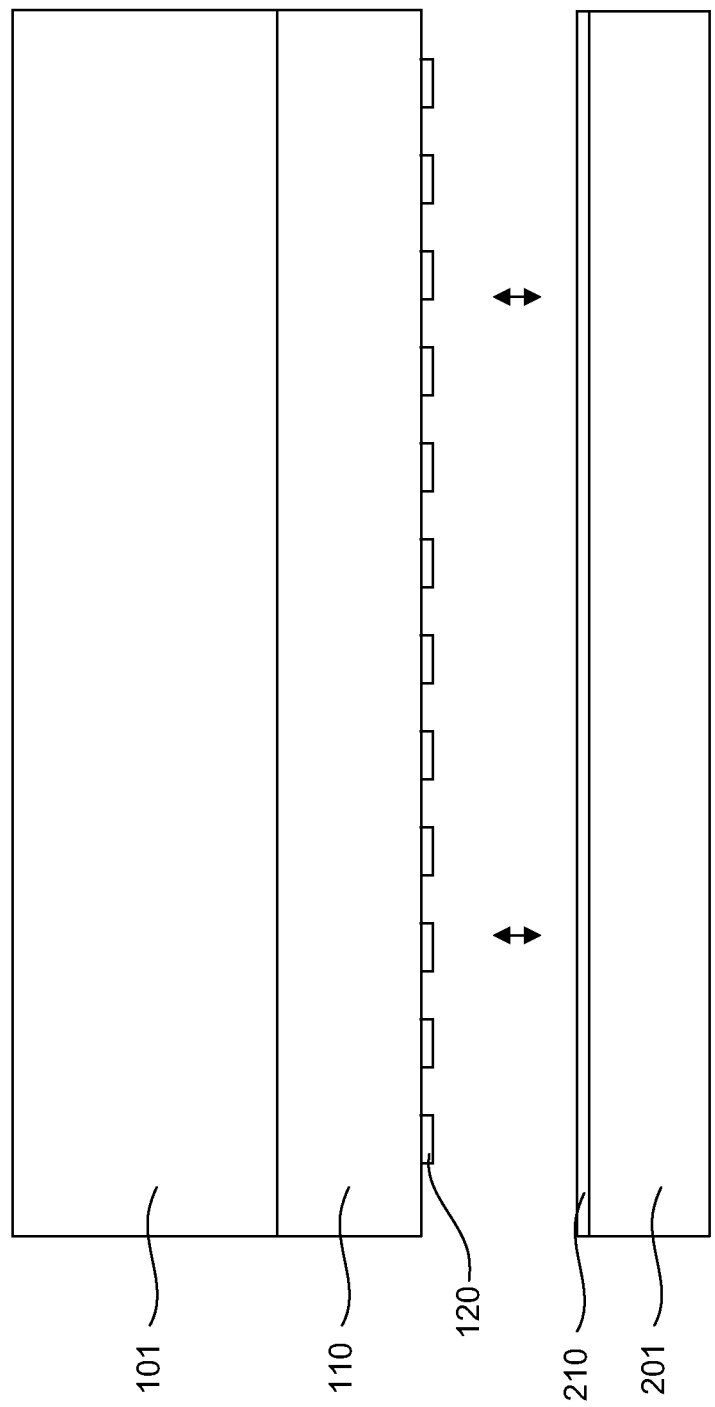
FIG. 3 is a cross-sectional side view illustration of bonding a growth substrate and carrier substrate together in accordance with an embodiment of the invention.

Referring now to FIG. 3, the growth substrate 101 and carrier substrate 201 may be bonded together under heat and/or pressure. It is to be appreciated that while FIG. 3 illustrates the bonding of the patterned structure of FIG. 1B with the unpatterned structure of FIG. 2A, that any combination of FIGS. 1A-1C and FIGS. 2A-2E are contemplated in accordance with embodiments of the invention. In addition, while it has been described that bonding layer 210 is formed on the carrier substrate 201 prior to bonding, it is also possible that the bonding layer 210 is formed on the metallization layer 120 of the growth substrate 101 prior to bonding. For example, bonding layer 210 could be formed over metallization layer 120, and patterned with metallization layer 120 during formation of the laterally separate locations of metallization layer illustrated in FIG. 1B. While not illustrated, depending upon the particular arrangement and composition of layers in formed on the substrates to be bonded together, an oxidation resistant film may be formed on the top surface of either or both substrates to prevent oxidation prior to bonding. For example, in one embodiment, a thin gold film can be deposited on either or both of the exposed surface of metallization layer 120 and bonding layer 210. During bonding of the substrates illustrated in FIG. 3, the bonding layer 210 may partially soak up the gold film resulting in a gold alloy at the bonding interface between the substrates.

Figure 4:
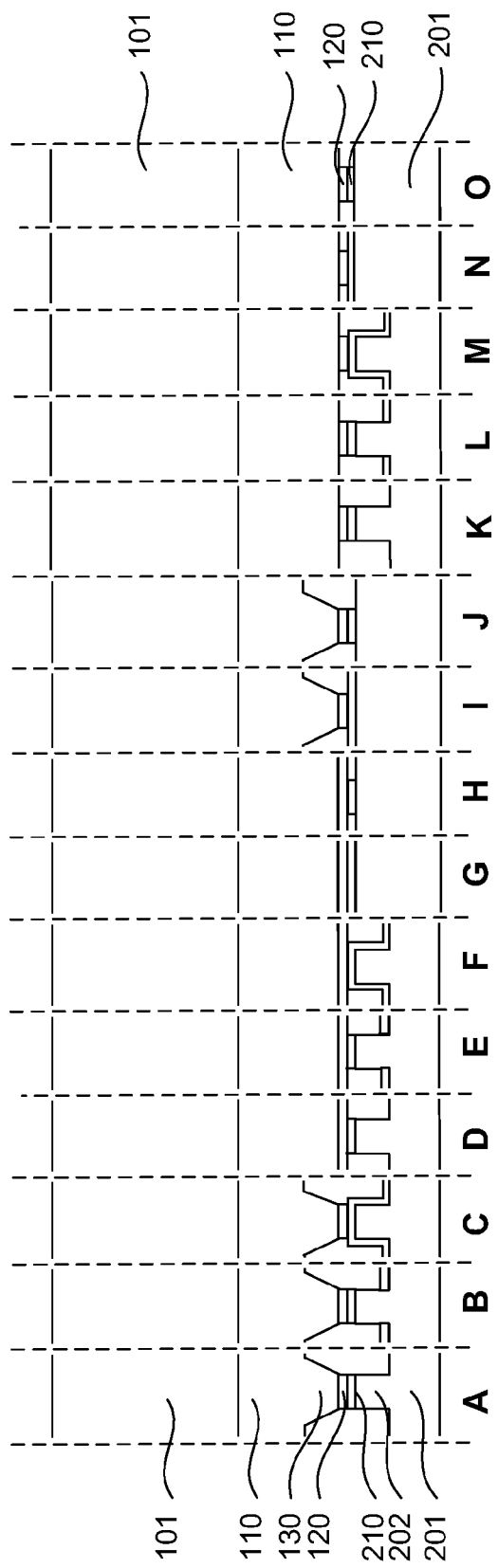
FIG. 4 is a cross-sectional side view illustration of various possible structures after bonding the growth substrate and carrier substrate together in accordance with an embodiment of the invention.

FIG. 4 is a cross-sectional side view illustration of various non-limiting possible structures after bonding the growth substrate 101 and carrier substrate 201. The particular combinations of substrates are described in Table 3. For example, the particular embodiment illustrated in Example 4A represents the bonding of the carrier substrate illustrated in FIG. 2D to the growth substrate illustrated in FIG. 1C.

TABLE 3

| | Ex. 4A | Ex. 4B | Ex. 4C | Ex. 4D | Ex. 4E | Ex. 4F | Ex. 4G | Ex. 4H | Ex. 4I | Ex. 4J | Ex. 4K | Ex. 4L | Ex. 4M | Ex. 4N | Ex. 4O |
|---|---|---|---|---|---|---|---|---|---|---|---|---|---|---|---|
| Carrier Substrate (2A-2D) | 2D | 2C | 2B | 2D | 2C | 2B | 2A | 2E | 2A | 2E | 2D | 2C | 2B | 2A | 2E |
| Growth Substrate (1B) | 1C | 1C | 1C | 1A | 1A | 1A | 1A | 1A | 1C | 1C | 1B | 1B | 1B | 1B | 1B |

As described above, the structures of many of the examples can also be created by forming the bonding layer 210 on the growth substrate, followed by bonding the growth substrate 101 to the carrier substrate 201. For example, example 4O, can also be created by patterning bonding layer 210 and metallization layer 210 on growth substrate 101, following by bonding the growth substrate 101 to carrier substrate 201.

Figure 5:
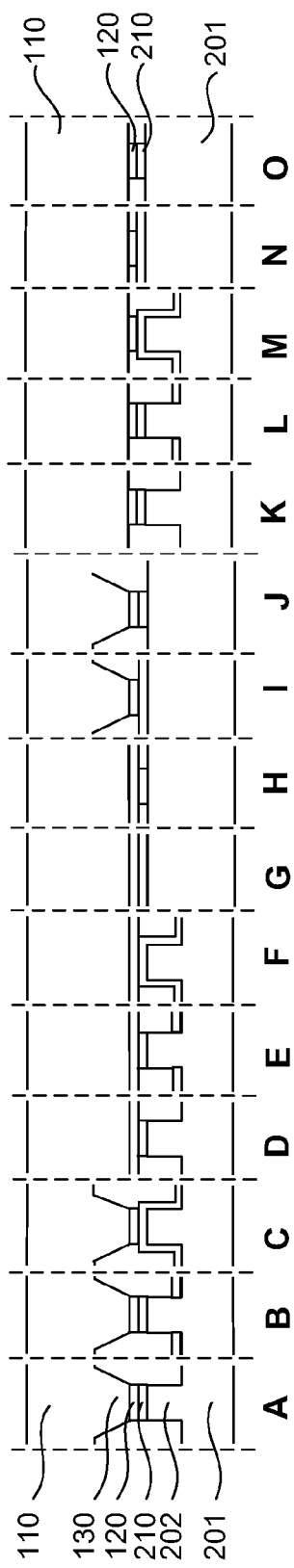
FIG. 5 is a cross-sectional side view illustration of the growth substrate removed from the bonded structure in accordance with an embodiment of the invention.

Referring now to FIG. 5, the growth substrate 101 has been removed from the bonded structure. Growth substrate 101 may be removed by a suitable method such as chemical etching or an excimer laser-based lift-off (LLO) if the growth substrate is transparent. In an embodiment, LLO of a GaN p-n diode layer 110 from a transparent sapphire growth substrate 101 is accomplished by irradiating the 101/110 layer interface through the transparent sapphire growth substrate 101 with a short pulse (e.g. tens of nanoseconds) from an ultraviolet laser such as a Nd-YAG laser or KrF excimer laser. Absorption in the GaN p-n diode layer 110 at the interface results in localized heating of the interface resulting in decomposition at the interfacial GaN to liquid Ga metal and nitrogen gas. Once the desired are has been irradiated, the transparent sapphire growth substrate 101 can be removed by remelting the Ga on a hotplate.

Figure 6:
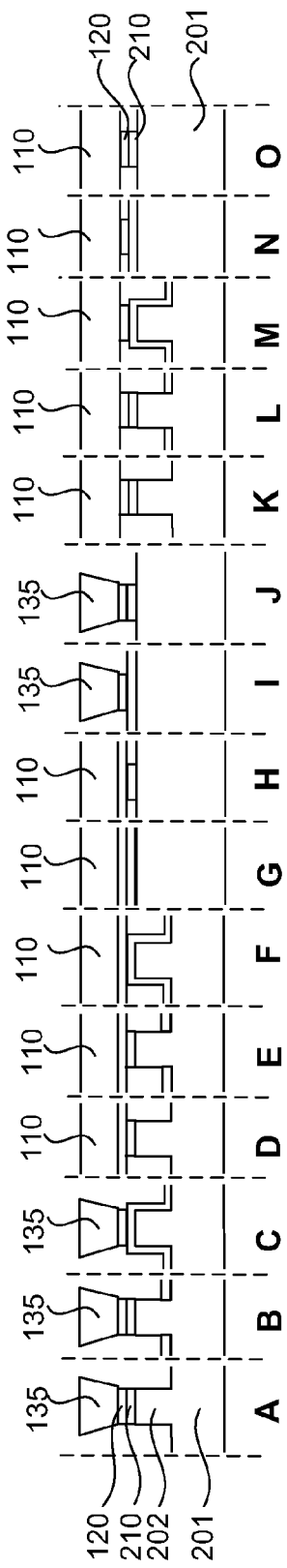
FIG. 6 is a cross-sectional side view illustration of a thinned-down p-n diode layer in accordance with an embodiment of the invention.

Referring now to FIG. 6, the p-n diode layer 110 is thinned down to a desirable thickness. Referring back to the enlarged p-n diode layer 110 in FIG. 1A, a predetermined amount of the bulk GaN layer 112 (which may be n-type) or a portion of the n-type GaN layer 114 are removed so that an operable p-n diode remains after thinning. Depending upon the underlying structure, the thinning process may be performed utilizing suitable techniques such as polishing, wet etching or dry etching. For example, a combination of polish and/or timed etch to a desired thickness may be performed. In circumstances where there are underlying patterned structures such as pillars or micro mesas, a timed etch to a desired thickness may be performed in order to avoid damaging the patterned structures. As shown in Examples 6A, 6B, 6C, 6I and 6J where the p-n diode layers 110 were pre-patterned to form micro mesas 130, they are now free-standing micro p-n diodes 135.

Figure 7:
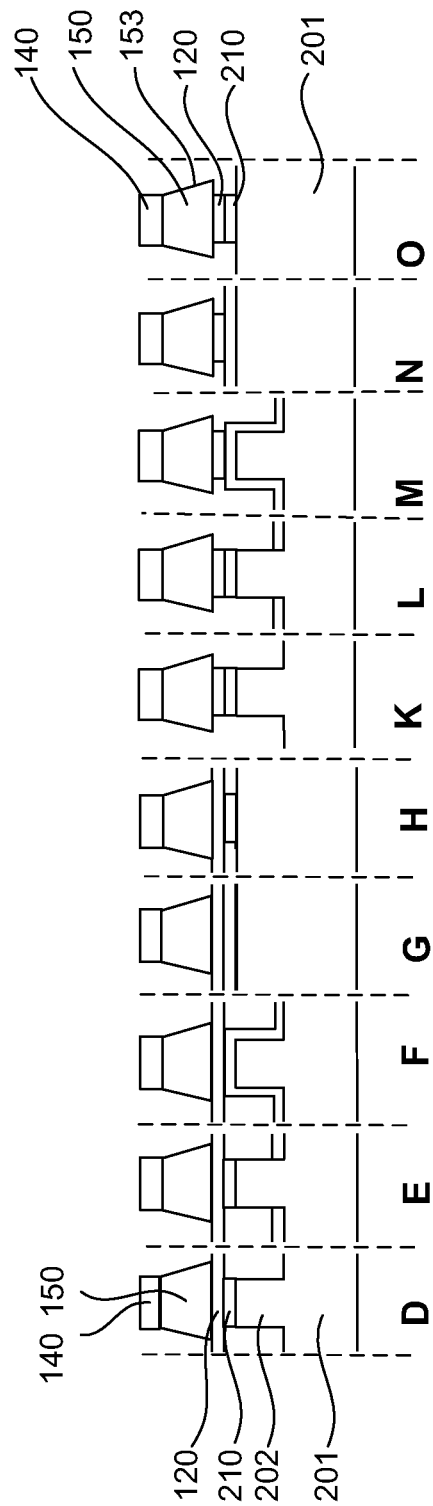
FIG. 7 is a cross-sectional side view illustration of etching p-n diode layer to form micro p-n diodes in accordance with an embodiment of the invention.

If either of the growth substrate 101 or carrier substrate 201 structures were not pre-patterned or only partially pre-patterned prior to bonding, then additional patterning may be performed after the p-n diode layer 110 thinning illustrated in FIG. 6. As illustrated in FIG. 7 a patterned mask layer 140 may be formed over the unpatterned p-n diode layer 110 for etching of p-n diode layer 110 to form free standing micro p-n diodes 150. Mask layer 140 may be formed from photoresist or a variety of materials such as metal (e.g. chromium, nickel) or dielectric (silicon nitride, silicon oxide) which are more resistant to the GaN etching conditions than is photoresist. Etching of the GaN p-n diode layer 110 can be performed utilizing dry plasma etching techniques such as reactive ion etching (RIE), electro-cyclotron resonance (ECR), inductively coupled plasma reactive ion etching (ICP-RIE), and chemically assisted ion-beam etching (CAIBE). The etch chemistries may be halogen-based, containing species such as $Cl_2$, $BCl_3$ or $SiCl_4$.

In the particular embodiment illustrated in FIG. 7, micro p-n diodes 150 may have outwardly tapered sidewalls 153 (from top to bottom of the micro p-n diodes 150) up to 15 degrees. For example, RIE with a chlorine-based etch chemistry may be utilized. Alternatively, the sidewalls 153 may be vertical. For example, ICP-RIE which a chlorine-based etch chemistry may be utilized to obtain vertical sidewalls. As will become apparent in the description of FIG. 16, outwardly tapered sidewalls may be advantageous in some embodiments when forming a common contact over a series of micro LED structures which have been picked up and transferred to a receiving substrate. In certain embodiments, the pitch between the micro p-n diodes 150 may be 5 µm, 10 µm, or larger. For example, a micro p-n diode 150 array with a 5 µm pitch may be formed of 3 µm wide micro p-n diodes separated by a 2 µm spacing. A micro p-n diode 150 array with a 10 µm pitch may be formed of 8 µm wide micro p-n diodes separated by a 2 µm spacing.

Referring now to FIGS. 7'-7", etching may optionally be continued on metallization layer 120 and/or bonding layer 210 utilizing suitable etching chemistries based upon the particular materials in metallization layer 120 and bonding layer 210. In certain embodiments illustrated in FIG. 7', anisotropic etching with a dry etching chemistry can be utilized to etch metallization layer 120 and/or bonding layer 210 so that the layers 120, 210 have a width matching the overlying lower surface of the micro p-n diode 150. In certain embodiments illustrated in FIG. 7", wet etching may be utilized to "undercut" the metallization layer 120 and/or bonding layer 210 underneath the overlying lower surface of the micro p-n diode 150 as illustrated in Examples 7"D-7"H. While not specifically illustrated, it is understood that etching could also be performed to "undercut" the underlying layers 120, 210 underneath micro p-n diodes 135.

Figure 8:
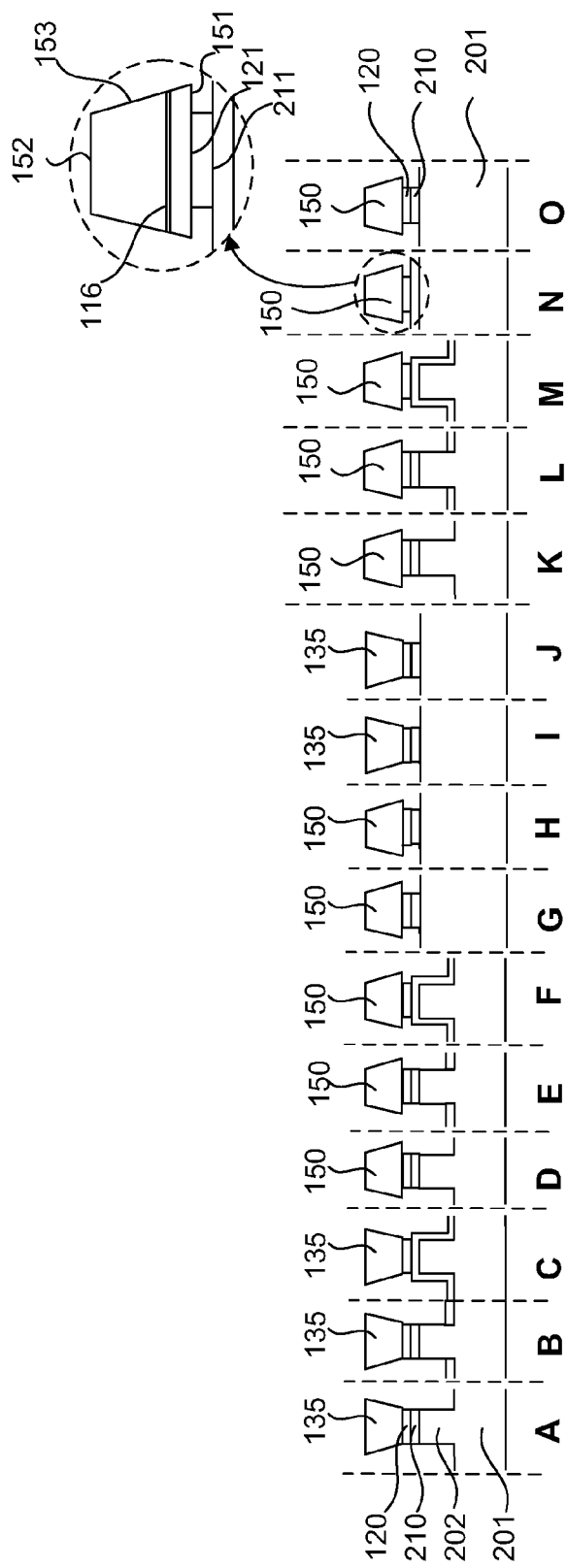
FIG. 8 is a cross-sectional side view illustration of various micro LED structures in accordance with an embodiment of the invention.

Upon completion of etching processes for the micro p-n diodes, metallization layer or bonding layer, the mask layer 140 may be removed, for example by using a selective etching technique, resulting the micro LED array illustrated in FIG. 8. As illustrated, the micro LED array includes a carrier substrate 201, a plurality of locations of a bonding layer 210 (which may or may not be laterally separate) on the carrier substrate, and a respective plurality of separate micro p-n diodes 135, 150 over the plurality of locations of the bonding layer 210. A plurality of separate locations of metallization layer 120 are formed between the respective plurality of separate micro p-n diodes 135, 150 and the plurality of locations of the bonding layer 210. In some embodiments, the carrier substrate includes a respective plurality of pillars 202 on which the plurality of laterally separate locations of the bonding layer 210 are formed, as illustrated in Examples 8A-8F and Examples 8K-8M.

In some embodiments, the micro p-n diodes 150 (as well as micro p-n diodes 135) include a top surface 152 and a bottom surface 151, and the metallization layer 120 includes a top surface 121 and a bottom surface, and the bottom surface 151 of the micro p-n diode 150 (as well as micro p-n diodes 135) is wider than the top surface 121 of the metallization layer 120.

In some embodiments, the plurality of micro p-n diodes 135, 150 each include a bottom surface 151 which has approximately the same width as a top surface 203 of each of the respective plurality of pillars 202. In other embodiments, the plurality of micro p-n diodes 135, 150 each include a bottom surface 151 which is wider than a top surface 203 of each of the respective plurality of pillars 202. The relationship of the micro p-n diode 135, 150 bottom width and underlying pillar 202 top surface may affect the pick up process. For example, if the bonding layer 210 exhibits a phase change from solid to liquid during the pick up process then the micro p-n diode 135, 150 is essentially floating on a liquid layer. Surface tension forces in the liquid bonding layer 210 may retain the micro p-n diode 135, 150 in place on top of the pillar 202. In particular, surface tension forces associated with the edges of the top surface of the pillar 202 may further assist in maintaining the micro p-n diode 135, 150 in place where the pillar 202 top surface width is less than or approximately equal to the p-n diode 135, 150 bottom width.

In some embodiments, the plurality of micro p-n diodes 135, 150 are positioned over an unpatterned bonding layer 210. For example, as illustrated in Example 6I and Example 8N, the bonding layer 210 may be a uniform layer on the carrier substrate and the corresponding plurality of locations of the bonding layer 210 are not laterally separate from each other. In other embodiments, the plurality of micro p-n diodes 135, 150 are positioned over a pattered bonding layer 210. For example, as illustrated in Examples 8A-8M and Example 8O, the patterned bonding layer may include a plurality of laterally separate locations of the bonding layer 210. In an embodiment, the plurality of micro p-n diodes 135, 150 each include a bottom surface 151 which has approximately the same or greater width than a corresponding top surface 211 for a plurality of laterally separate locations of the bonding layer 210.

As previously described the bonding layer may absorb compression forces associated with contacting the micro LED structure with a transfer head during the pick up process. As a result, the bonding layer may absorb the compressive forces and bulge out laterally. Where each micro LED structure is patterned to have a small separation distance, of 2 μm for example, the amount of bonding layer laterally protruding from each micro LED structure should be minimized so as to not interfere with an adjacent micro LED structure during the pick up process. In certain embodiments where trenches 206 are present between posts 202, the trenches may act as bonding layer reservoirs into which molten bonding layer may flow without interfering with an adjacent micro LED structure.

Figure 15:
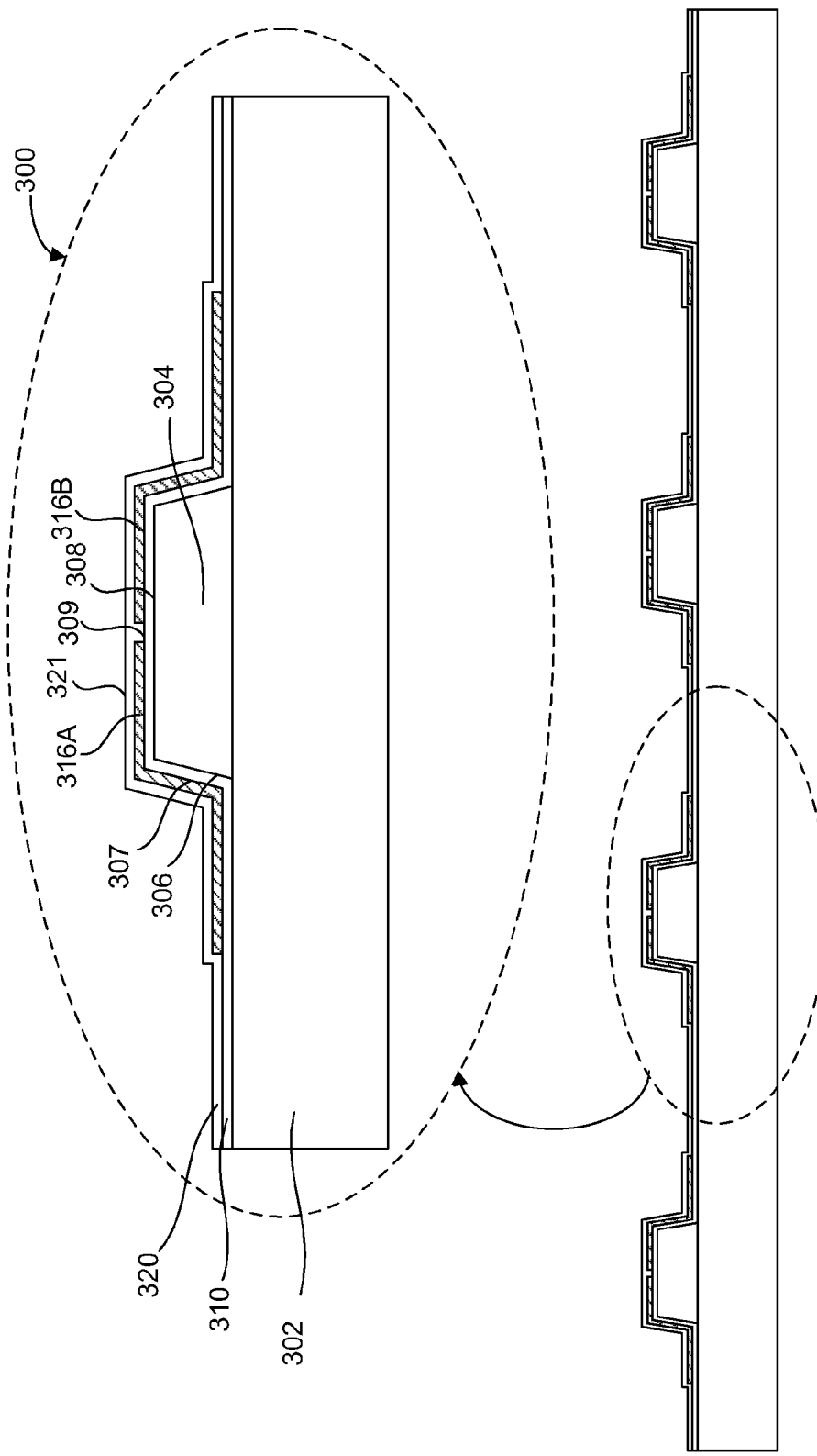
FIG. 15 is a cross-sectional side view illustration of a bipolar micro device transfer head in accordance with an embodiment of the invention.
Figure 16:
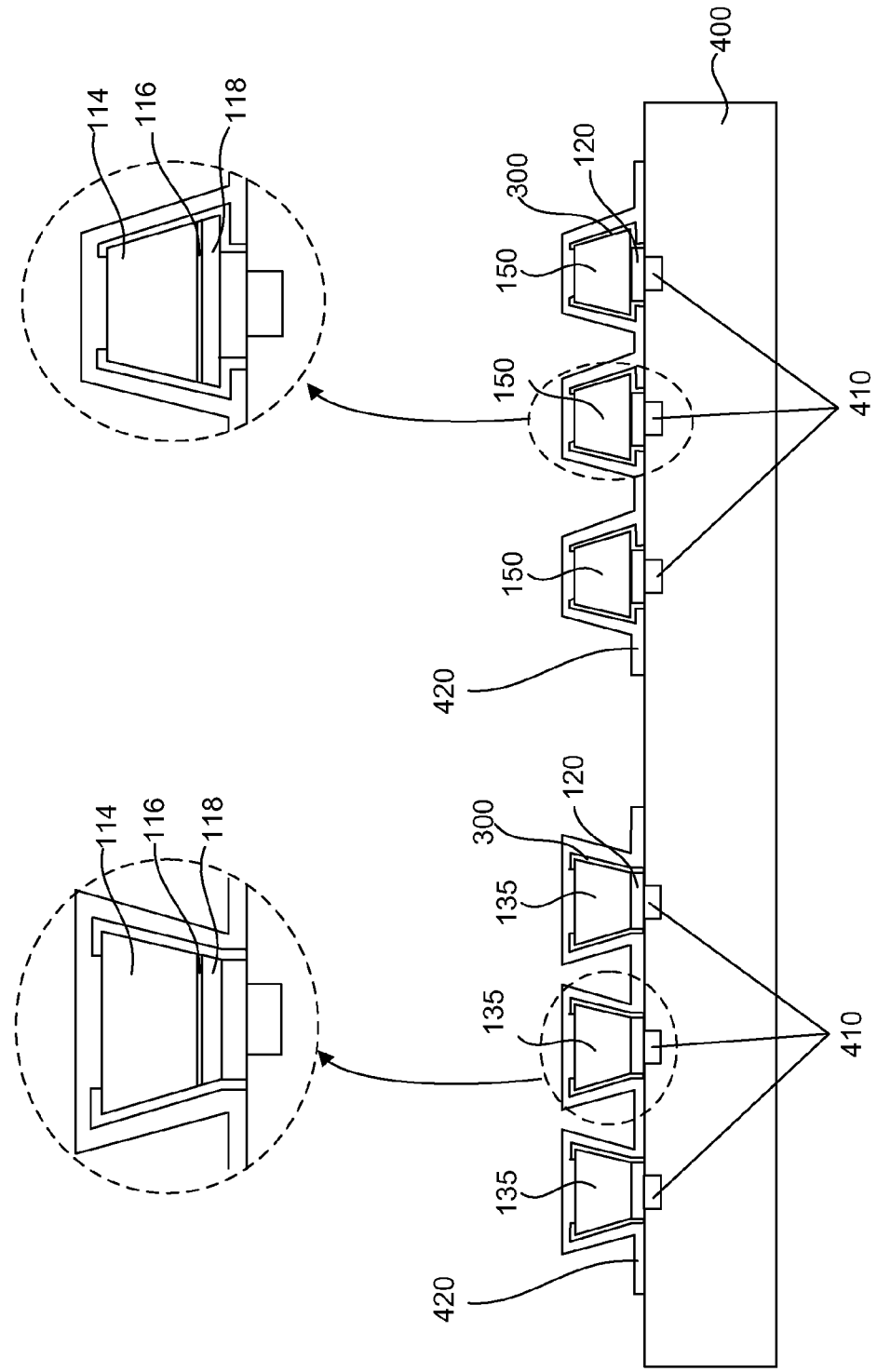
FIG. 16 is a cross-sectional side view illustration of a receiving substrate with a plurality of micro LEDs in accordance with an embodiment of the invention.

In some embodiments, the micro LED structures or array of micro LED structures of FIG. 8 (as well as the micro LED structures of FIG. 6 Example 6I, and FIG. 7 Examples 7'D-7'I after removal of layer 140) are poised for pick up and transfer to a receiving substrate, for example with a transfer head 300 described in more detail with regard to FIGS. 14-16. In other embodiments, a thin conformal dielectric barrier layer may be formed of an array of any of the micro p-n diodes 135, 150 prior to pick up and transfer to a receiving substrate. Referring now to FIGS. 9-9', a thin conformal dielectric barrier layer 160 may be formed over an array of any of the micro p-n diodes 150 of FIGS. 7-7". In one embodiment, the thin conformal dielectric barrier layer 160 may protect against charge arcing between adjacent micro p-n diodes 150 during the pick up process, and thereby protect against adjacent micro p-n diodes 150 from sticking together during the pick up process. The thin conformal dielectric barrier layer 160 may also protect the sidewalls 153, quantum well layer 116 and bottom surface 151, of the micro p-n diodes 150 from contamination which could affect the integrity of the micro p-n diodes 150. For example, the thin conformal dielectric barrier layer 160 can function as a physical barrier to wicking of the bonding layer material 210 up the sidewalls and quantum layer 116 of the micro p-n diodes 150 as described in more detail with regard to FIGS. 11A-11C in the following description. The thin conformal dielectric barrier layer 160 may also insulate the micro p-n diodes 150 once placed on a receiving substrate. In an embodiment, the thin conformal dielectric barrier layer 160 is approximately 50-600 angstroms thick aluminum oxide ($Al_2O_3$). Conformal dielectric barrier layer 160 may be deposited by a variety of suitable techniques such as, but not limited to, atomic layer deposition (ALD).

The thin conformal dielectric layer and contact openings can be formed using a mask layer lift off technique. Referring to FIGS. 9-9', the mask layer 140 illustrated in FIG. 7 for patterning the micro p-n diode 150 can also be used in a lift off technique for forming the thin conformal dielectric barrier layer 160 and contact opening 162. The thin conformal dielectric barrier layer 160 may be formed over an array of any of the micro p-n diodes 150 of FIG. 7, FIG. 7' or FIG. 7" and is conformal to and spans across exposed surfaces of the mask layer 140, and sidewalls 153 and the bottom surface 151 of the p-n diode 150. The conformal dielectric barrier layer 160 may also span across exposed surfaces of metallization layer 120, bonding layer 210, as well as the carrier substrate and posts 202, if present. The mask layer 140 is then removed, lifting off the portion of the thin conformal dielectric barrier layer 160 formed thereon resulting in the structure illustrated in FIG. 9' including contact openings 162. In the particular embodiment illustrated in FIG. 9', the conformal dielectric barrier layer 160 is not formed on the top surface 152 of the micro p-n diode 150.

Referring to FIGS. 10-10" the thin conformal dielectric layer can also be formed over the array of micro p-n diodes 135, 150 of FIG. 8 (as well as the micro LED structures of FIG. 6 Example 6I, and FIG. 7 Examples 7'D-7'I after removal of layer 140) followed by patterning to create contact openings 162. As illustrated in FIG. 9, the thin conformal dielectric barrier layer 160 may be formed over an array of any of the micro p-n diodes 150 and is conformal to and spans across the exposed top surface and sidewalls of the p-n diodes 150. The dielectric barrier layer 160 may also span across the exposed bottom surface 151 of the p-n diodes 135, 150 and surfaces of metallization layer 120, bonding layer 210, as well as the carrier substrate 201 and posts 202, if present. A blanket photoresist layer may then be formed over the p-n diode array and carrier substrate 201, and then patterned to form openings over each micro p-n diode 135, 150. The thin conformal dielectric barrier layer 160 may then be etched to form contact openings 162 on the top surface of each micro p-n diode 135, 150. Contact openings 162 are illustrated in FIGS. 10'-10" after removal of the patterned photoresist. As illustrated in FIG. 10', contact openings 162 may have a slightly smaller width than the top surface of the micro p-n diodes 135, 150. The difference in width may be a result of adjusting for an alignment tolerance in patterning the photoresist. As a result, the conformal dielectric barrier layer 160 may form a lip around the top surface and sidewalls of the micro p-n diodes 135, 150. As illustrated in FIG. 10", contact openings 162 may have a slightly larger width than the top surface of the micro p-n diodes 135, 150. In the embodiment illustrated in FIG. 10" the contact openings 162 expose the top surfaces of the micro p-n diodes 150 and an upper portion of the sidewalls of the micro p-n diodes 150, while the dielectric barrier layer 160 covers and insulates the quantum well layers 116.

Figure 11A:
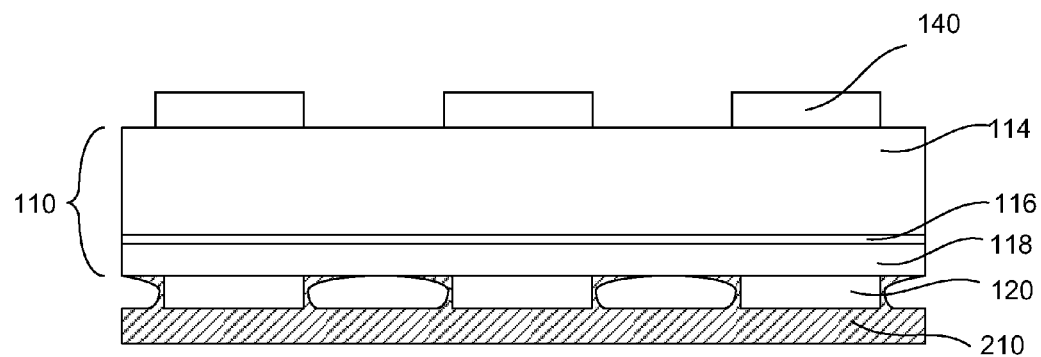
FIGS. 11A-11C are cross sectional side view illustrations of a wicked up bonding layer in accordance with an embodiment of the invention.
Figure 11B:
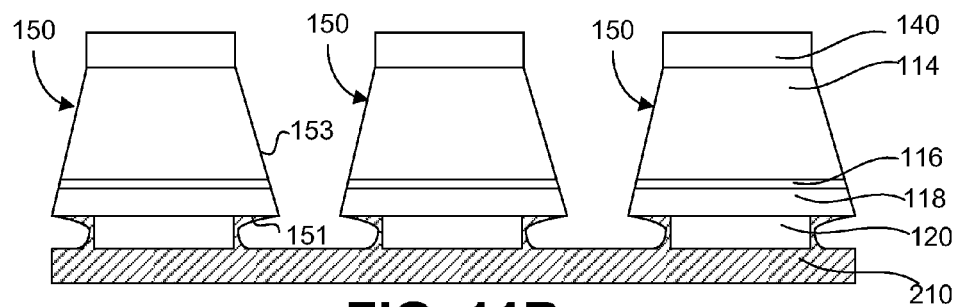
Figure 11C:
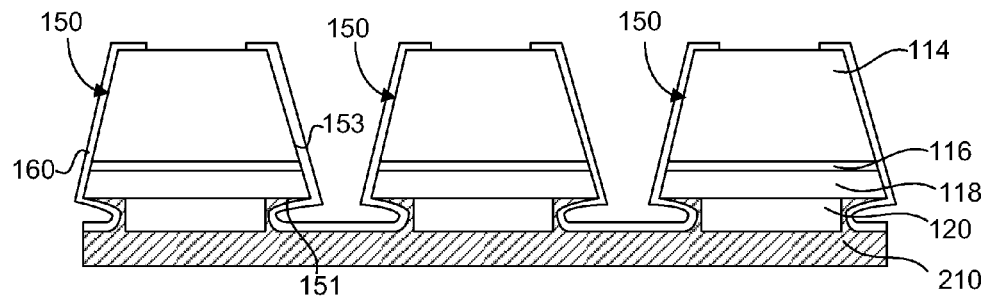

Referring now to FIGS. 11A-11C, in accordance with some embodiments of the invention it is possible that an amount of bonding layer 210 wicks up along the side surfaces of the metallization layer 120 and along the bottom surface 151 of the p-n diode layer 110 during the bonding operation illustrated in FIG. 3. Referring to FIG. 11B, it is possible that after forming the micro p-n diodes 150, that the amount bonding layer 210 which has wicked up could potentially continue its migration along the sidewalls 153 of the micro p-n diode 150 during subsequent processing. Continued migration toward the quantum well layer 116 could interfere with the operation of the micro p-n diode 150. Referring now to FIG. 11C, in accordance with embodiments of the invention, the conformal dielectric barrier layer 160 may function as a physical barrier to protect the sidewalls 153 and quantum well layer 116 of the micro p-n diodes 150 from contamination by the bonding layer material 210 during subsequent temperature cycles (particularly at temperatures above the liquidus or melting temperature of the bonding layer material 210) such as during picking up the micro device from the carrier substrate, and releasing the micro device onto the receiving substrate. While FIGS. 11A-11C have been illustrated and described with reference to micro p-n diodes 150, it is also contemplated that it is possible that an amount of bonding layer 210 could wick up and continue its migration along the sidewalls of micro mesas 130 used to form micro p-n diodes 135 during the bonding operation illustrated in FIG. 3. Conformal dielectric barrier layer 160 may similarly function as a physical barrier to protect the sidewalls and quantum well layer 116 of the micro p-n diodes 135 from contamination by the bonding layer material 210.

FIGS. 12A-12B include top and cross-sectional side view illustrations of a carrier substrate 201 and array of micro LED structures in accordance with an embodiment of the invention. In the particular embodiments illustrated, the arrays are produced from micro LED structures of Example 10'N including micro p-n diode 150. However, it is to be appreciated that FIGS. 12A-12B are meant to be exemplary, and that the array of micro LED structures can be formed from any of the micro LED structures previously described. In the embodiment illustrated in FIG. 12A, each individual micro p-n diode 150 is illustrated as a pair of concentric circles having different diameters or widths corresponding the different widths of the top and bottom surfaces of the micro p-n diode 150, and the corresponding tapered sidewalls spanning between the top and bottom surfaces. In the embodiment illustrated in FIG. 12B, each individual micro p-n diode 150 is illustrated as a pair of concentric squares with tapered or rounded corners, with each square having a different width corresponding to the different widths of the top and bottom surfaces of the micro p-n diode 150, and the corresponding tapered sidewalls spanning from the top and bottom surfaces. However, embodiments of the invention do not require tapered sidewalls, and the top and bottom surfaces of the micro p-n diode 150 may have the same diameter, or width, and vertical sidewalls. As illustrated in FIGS. 12A-12B the array of micro LED structures is described as having a pitch (P), spacing (S) between each micro LED structure and maximum width (W) of each micro LED structure. In order for clarity and conciseness, only x-dimensions are illustrated by the dotted lines in the top view illustration, though it is understood that similar y-dimensions may exist, and may have the same or different dimensional values. In the particular embodiments illustrated in FIGS. 12A-12B, the x- and y-dimensional values are identical in the top view illustration. In one embodiment, the array of micro LED structures may have a pitch (P) of 10 μm, with each micro LED structure having a spacing (S) of 2 μm and maximum width (W) of 8 μm. In another embodiment, the array of micro LED structures may have a pitch (P) of 5 μm, with each micro LED structure having a spacing (S) of 2 μm and maximum width (W) of 3 μm. However, embodiments of the invention are not limited to these specific dimensions, and any suitable dimension may be utilized.

An embodiment of a method of transferring a micro LED structure to a receiving substrate is described in FIG. 13. In such an embodiment a carrier substrate is provided having an array of micro LED structures disposed thereon. As described above, each micro LED structure may include a micro p-n diode and a metallization layer, with the metallization layer between the micro p-n diode and a bonding layer on the carrier substrate. A conformal dielectric barrier layer may optionally span sidewalls of the micro p-n diode. The conformal dielectric barrier layer may additionally span a portion of the bottom surface of the micro p-n diode, as well as sidewalls of the metallization layer, and bonding layer if present. Then at operation 1310 a phase change is created in the bonding layer for at least one of the micro LED structures. For example, the phase change may be associated with heating the bonding layer above a melting temperature or liquidus temperature of a material forming the bonding layer or altering a crystal phase of a material forming the bonding layer. The micro p-n diode and metallization layer, optionally a portion of the conformal dielectric barrier layer for at least one of the micro LED structures, and optionally a portion of bonding layer 210 may then be picked up with a transfer head in operation 1320 and then placed on a receiving substrate in operation 1330.

A general illustration of operation 1320 in accordance with an embodiment is provided in FIG. 14 in which a transfer head 300 picks up a micro p-n diode, metallization layer, a portion of the conformal dielectric barrier layer for at least one of the micro LED structures, and a portion of bonding layer 210. In the particular embodiment illustrated a conformal dielectric barrier layer has been formed, however, in other embodiments a conformal dielectric barrier layer may not be present. In some embodiments a portion of bonding layer 210, such as approximately half, may be lifted off with the micro LED structure. While a specific micro LED structure including micro p-n diode 150 is illustrated, it is understood than any of the micro LED structures including any of the micro p-n diodes 150 described herein may be picked up. In addition, while the embodiment illustrated in FIG. 14 shows a transfer head 300 picking up a single micro LED structure, transfer head 300 may pick up a group of micro LED structures in other embodiments.

Still referring to FIG. 14, in the particular embodiment illustrated the bottom surface of the micro p-n diode 150 is wider than the top surface of the metallization layer 120, and the conformal dielectric barrier layer 160 spans the sidewalls of the micro p-n diode 150, a portion of the bottom surface of the micro p-n diode 150 and sidewalls of the metallization layer 120. This may also apply for micro p-n diodes 135. In one aspect, the portion of the conformal dielectric barrier layer 160 wrapping underneath the micro p-n diode 135, 150 protects the conformal dielectric barrier layer 160 on the sidewalls of the micro p-n diode 150 from chipping or breaking during the pick up operation with the transfer head 300. Stress points may be created in the conformal dielectric barrier layer 160 adjacent the metallization layer 120 or bonding layer 210, particularly at corners and locations with sharp angles. Upon contacting the micro LED structure with the transfer head 300 and/or creating the phase change in the bonding layer, these stress points become natural break points in the conformal dielectric barrier layer 160 at which the conformal dielectric layer can be cleaved. In an embodiment, the conformal dielectric barrier layer 160 is cleaved at the natural break points after contacting the micro LED structure with the transfer head and/or creating the phase change in the bonding layer, which may be prior to or during picking up the micro p-n diode and the metallization layer. As previously described, in the liquid state the bonding layer may smooth out over the underlying structure in response to compressive forces associated with contacting the micro LED structure with the transfer head. In an embodiment, after contacting the micro LED structure with the transfer head, the transfer head is rubbed across a top surface of the micro LED structure prior to creating the phase change in the bonding layer. Rubbing may dislodge any particles which may be present on the contacting surface of either of the transfer head or micro LED structure. Rubbing may also transfer pressure to the conformal dielectric barrier layer. Thus, both transferring a pressure from the transfer head 300 to the conformal dielectric barrier layer 160 and heating the bonding layer above a liquidus temperature of the bonding layer can contribute to cleaving the conformal dielectric barrier layer 160 at a location underneath the micro p-n diode 135, 150 and may preserve the integrity of the micro LED structure and quantum well layer. In an embodiment, the bottom surface of the micro p-n diode 135, 150 is wider than the top surface of the metallization layer 120 to the extent that there is room for the conformal dielectric barrier layer 160 to be formed on the bottom surface of the micro p-n diode 135, 150 and create break points, though this distance may also be determined by lithographic tolerances. In an embodiment, a 0.25 μm to 1 μm distance on each side of the micro p-n diode 135, 150 accommodates a 50 angstrom to 600 angstrom thick conformal dielectric barrier layer 160.

A variety of suitable transfer heads can be utilized to aid in the pick up and placement operations 1320, 1330 in accordance with embodiments of the invention. For example, the transfer head 300 may exert a pick up pressure on the micro LED structure in accordance with vacuum, magnetic, adhesive, or electrostatic principles in order to pick up the micro LED structure.

FIG. 15 is a cross-sectional side view illustration of a bipolar micro device transfer head which operates according to electrostatic principles in order to pick up the micro LED structure in accordance with an embodiment of the invention. As illustrated, the micro device transfer head 300 may include a base substrate 302, a mesa structure 304 including a top surface 308 and sidewalls 306, an optional passivation layer 310 formed over the mesa structure 304 and including a top surface 309 and sidewalls 307, a pair of electrodes 316A, 316B formed over the mesa structure 304 (and optional passivation layer 310) and a dielectric layer 320 with a top surface 321 covering the electrodes 316A, 316B. Base substrate 302 may be formed from a variety of materials such as silicon, ceramics and polymers which are capable of providing structural support. In an embodiment, base substrate has a conductivity between $10^3$ and $10^{18}$ ohm-cm. Base substrate 302 may additionally include wiring (not shown) to connect the micro device transfer heads 300 to the working electronics of an electrostatic gripper assembly.

FIG. 16 is an illustration of a receiving substrate 400 onto which a plurality of micro LED structures have been placed in accordance with an embodiment of the invention. For example, the receiving substrate may be, but is not limited to, a display substrate, a lighting substrate, a substrate with functional devices such as transistors, or a substrate with metal redistribution lines. In the particular embodiment illustrated, each micro LED structure may be placed over a driver contact 410. A common contact line 420 may then be formed over the series of micro p-n diodes 135, 150. As illustrated, the tapered sidewalls of the micro p-n diodes 135, 150 may provide a topography which facilitates the formation of a continuous contact line. In an embodiment, the common contact line 420 can be formed over a series of red-emitting, green-emitting or blue-emitting micro LEDs. In certain embodiments, the common contact line 420 will be formed from a transparent contact materials such as indium tin oxide (ITO). In one embodiment, the plurality of micro LEDs may be arranged into pixel groups of three including a red-emitting micro LED, green-emitting micro LED, and a blue-emitting micro LED.

Still referring to FIG. 16, a close up illustration of a p-n diode 135, 150 is provided in accordance with an embodiment of the invention. In one embodiment, the p-n diode 135, 150 may include a top n-doped layer 114 with a thickness of approximately 0.1 µm-3 µm, quantum well layer 116 (which may be SQW or MQW) with a thickness less than approximately 0.3 µm, and lower p-doped layer 118 with thickness of approximately 0.1 µm-1 µm. In an embodiment, top n-doped layer 114 may be 0.1 µm-6 µm thick (which may include or replace bulk layer 112 previously described). In a specific embodiment, p-n diodes 135, 150 may be less than 3 µm thick, and less than 10 µm wide.

In utilizing the various aspects of this invention, it would become apparent to one skilled in the art that combinations or variations of the above embodiments are possible for forming an array of micro LED structures which are poised for pick up and transfer to a receiving substrate. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A micro LED structure comprising:
a micro p-n diode;
a metallization layer;
wherein the metallization layer is between the micro p-n diode and a bonding layer formed on a substrate; and
a conformal barrier layer comprising a single layer of a same material that spans sidewalls of the micro p-n diode, sidewalls of the metallization layer, and sidewalls of the bonding layer.

2. The micro LED structure of claim 1, wherein the bonding layer has a liquidus temperature below approximately 350° C.

3. The micro LED structure of claim 1, wherein the conformal barrier layer forms an outline of the topography of the sidewalls of the micro p-n diode, the sidewalls of the metallization layer, and the sidewalls of the bonding layer.

4. The micro LED structure of claim 1, wherein the single layer of the same material is a conformal dielectric barrier layer that partially spans a bottom surface of the micro p-n diode.

5. The micro LED structure of claim 4, further comprising an opening in the conformal dielectric barrier layer exposing a top surface of the micro p-n diode, wherein the opening has a width selected from the group consisting of:
greater than a width of the top surface of the micro p-n diode;
less than the width of the top surface of the micro p-n diode; and
approximately the same as the width of the top surface of the micro p-n diode.

6. The micro LED structure of claim 1, wherein:
the micro p-n diode comprises a top surface and a bottom surface;
the metallization layer comprises a top surface and a bottom surface; and
the bottom surface of the micro p-n diode is wider than the top surface of the metallization layer.

7. The micro LED structure of claim 1, wherein the bonding layer comprises indium or tin.

8. The micro LED structure of claim 1, wherein the bonding layer comprises polyethylene or polypropylene.

9. The micro LED structure of claim 1, wherein the micro p-n diode comprises gallium nitride.

10. The micro LED structure of claim 1, wherein the metallization layer comprises an electrode layer and a barrier layer between the electrode layer and the bonding layer.

11. The micro LED structure of claim 1, wherein the micro p-n diode comprises a top surface, a bottom surface and tapered sidewalls.

12. The micro LED of claim 11, wherein the bottom surface is wider than the top surface.

13. The micro LED of claim 11, wherein the top surface is wider than the bottom surface or has a same width as the bottom surface.

14. The micro LED structure of claim 1, wherein:
the micro p-n diode comprises a top surface and a bottom surface;
the bonding layer comprises a top surface and a bottom surface; and
the bottom surface of the micro p-n diode is wider than the top surface of the bonding layer.

15. The micro LED structure of claim 1, wherein:
the micro p-n diode comprises a top surface and a bottom surface;
the bonding layer comprises a top surface and a bottom surface; and the bottom surface of the micro p-n diode is approximately the same width as the top surface of the bonding layer.

16. The micro LED structure of claim 1, wherein the single layer of the same material that spans the sidewalls of the micro p-n diode, the sidewalls of the metallization layer, and the sidewalls of the bonding layer is continuous.

17. The micro LED structure of claim 1, wherein the same material comprises $Al_2O_3$.

18. A micro LED array comprising:
a plurality of locations of a bonding layer on a substrate;
a corresponding plurality of micro LED structures on the plurality of locations of the bonding layer, wherein each micro LED structure comprises:
  a micro p-n diode; and
  a metallization layer, wherein the metallization layer is between the micro p-n diode and a respective location of the bonding layer; and
a conformal barrier layer comprising a single layer of a same material that spans sidewalls of each micro p-n diode, sidewalls of each metallization layer, and sidewalls of each of the plurality of locations of the bonding layer.

19. The micro LED array of claim 18, wherein the bonding layer has a liquidus temperature below approximately 350° C.

20. The micro LED array of claim 18, wherein the conformal barrier layer forms an outline of the topography of the sidewalls of the micro p-n diode, the sidewalls of the metallization layer, and the sidewalls of the bonding layer.

21. The micro LED array of claim 18, wherein the single layer of the same material is a conformal dielectric barrier layer that partially spans a bottom surface of each micro p-n diode.

22. The micro LED structure of claim 21, further comprising a plurality of openings in the conformal dielectric barrier layer exposing a top surface of each micro p-n diode, wherein each opening has a width selected from the group consisting of:
  greater than a width of the top surface of a corresponding micro p-n diode;
  less than the width of the top surface of the corresponding micro p-n diode; and
  approximately the same as the width of the top surface of corresponding micro p-n diode.

23. The micro LED structure of claim 18, wherein the plurality of locations of the bonding layer are laterally separate.

24. The micro LED array of claim 23, wherein the substrate comprises a respective plurality of pillars, and the plurality of locations of the bonding layer are formed on the respective plurality of pillars.

25. The micro LED array of claim 24, wherein each micro p-n diode comprises a bottom surface which is approximately the same width as a top surface a respective pillar.

26. The micro LED array of claim 24, wherein each micro p-n diode comprises a bottom surface which is wider than width of a top surface a respective pillar.

27. The micro LED array of claim 24, wherein the respective plurality of pillars each have a respective height which is greater than a respective thickness of each of the locations of the bonding layer.

28. The micro LED array of claim 27, wherein each respective height is at least twice the respective thickness.

29. The micro LED array of claim 18, wherein the plurality of locations of the bonding layer are not laterally separate.

30. The micro LED array of claim 18, wherein:
each micro p-n diode comprises a top surface and a bottom surface;
each metallization layer comprises a top surface and a bottom surface; and
the bottom surface of each micro p-n diode is wider than the corresponding top surface of the metallization layer.

31. The micro LED array of claim 18, wherein each micro p-n diode comprises a top surface and a bottom surface which is wider than the top surface.

32. The micro LED structure of claim 18, wherein each portion of the single layer of the same material that spans the sidewalls of the each micro p-n diode, the sidewalls of the each metallization layer, and the sidewalls of the each bonding layer is continuous.

33. The micro LED structure of claim 18, wherein the same material comprises $Al_2O_3$.

\* \* \* \* \*